(12) United States Patent
Schwartz et al.

(10) Patent No.: US 7,443,319 B2
(45) Date of Patent: Oct. 28, 2008

(54) PRECISION-RESOLUTION CONSTRAINED CODING SCHEME

(75) Inventors: Moshe Schwartz, Pasadena, CA (US); Jehoshua Bruck, La Canada, CA (US)

(73) Assignee: California Institute of Technology, Pasadena, CA (US)

(*) Notice: Subject to any disclaimer, the term of this patent is extended or adjusted under 35 U.S.C. 154(b) by 103 days.

(21) Appl. No.: 11/623,736

(22) Filed: Jan. 16, 2007

(65) Prior Publication Data

US 2007/0164881 A1 Jul. 19, 2007

Related U.S. Application Data

(60) Provisional application No. 60/760,534, filed on Jan. 16, 2006.

(51) Int. Cl.
*H03M 5/00* (2006.01)

(52) U.S. Cl. .................................. 341/58; 341/50

(58) Field of Classification Search .............. 341/50, 341/51, 58; 375/247
See application file for complete search history.

(56) References Cited

U.S. PATENT DOCUMENTS 7,145,954 B1 * 12/2006 Pendergrass et al. ........ 375/247

* cited by examiner

*Primary Examiner*—Rexford Barnie
*Assistant Examiner*—Joseph Lauture
(74) *Attorney, Agent, or Firm*—Townsend and Townsend and Crew LLP

(57) ABSTRACT

A coding scheme for data is presented in which data is encoded and decoded such that a sequence of unconstrained input binary symbols, such as 1's and 0's, is encoded into a representation according to an alphabet comprising allowable time intervals between adjacent input binary symbols according to a precision parameter p, a minimum resolution parameter $\alpha$, and resolution restriction functions L(t) and R(t), thereby defining a precision-resolution (PR) constrained code, and is modulated into an output signal comprising a waveform having signal peaks corresponding to the representation and separated according to the PR-constrained code for transmission of the output signal over the data channel. In this discussion, the minimum resolution parameter is denoted as a and is not limited to integer values.

44 Claims, 15 Drawing Sheets

(a)

(b)

PRECISION-RESOLUTION CONSTRAINED CODING SCHEME

CROSS-REFERENCES TO RELATED APPLICATIONS

This application claims the benefit of U.S. Provisional Patent Application Ser. No. 60/760,534 entitled "Precision Resolution Constrained Coding Scheme" by Moshe Schwartz and Jehoshua Bruck, filed Jan. 16, 2006. Priority of the filing date is hereby claimed, and the disclosure of the application is hereby incorporated by reference.

STATEMENT AS TO RIGHTS TO INVENTIONS MADE UNDER FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. AN1-0322475 awarded by The National Science Foundation.

BACKGROUND OF THE INVENTION

1. Field of the Invention

This invention relates to digital data representation and, more particularly, to coding schemes that can be used to represent sequences of binary symbols for data storage and data transmission systems.

2. Description of the Related Art

The design of communication and storage systems requires a choice of modulation and coding. In conventional storage and communication systems, the most commonly used modulation scheme is called Non Return to Zero (NRZ). Systems based on NRZ modulation use special codes to represent data. The most commonly used codes are called Run Length Limited (RLL) codes.

A. NRZ (Non Return to Zero) Modulation

In data storage systems and data communication systems, data is stored or transmitted through the modulation of some physical quantity. In the context of data storage in magnetic media, the modulated quantity is the polarity of bar magnets that are created on the magnetic media by a write head. For data storage in recordable optical media, the quantity that is modulated to store data is the disc reflectivity. In the context of fiber optic modulation, the quantity that is modulated in order to transmit data is intensity of a laser beam. In the context of wireless communication, the quantity that is modulated to transmit data is either the frequency, amplitude, or phase of a radio frequency (RF) signal. In wire line communication, the physical quantity that is modulated to transmit data is voltage of a signal.

For purposes of storage and communication in the above contexts, different modulation schemes can be used. The most commonly used modulation scheme is called Non Return to Zero (NRZ). The salient feature of NRZ is that the signal is binary (has two states) and state transitions can occur only at regular periods in time. Thus the time between any two transitions is always an integer multiple of some time constant as is illustrated in FIG. 1a. The modulated signal waveform 102 in FIG. 1a is shown with the horizontal axis 104 representing time and the vertical axis 106 representing the modulated physical quantity. NRZ signals can be used to represent binary data using two different conventions. In the first convention, one of the two states corresponds to a logical zero and the other corresponds to a logical one. This is illustrated in FIG. 1b. In the second convention, a state transition is used to represent a logical one and the absence of a state transition is used to represent a logical zero. This is illustrated in FIG. 1c. It should be noted that all binary signals can be uniquely represented by NRZ signals using either convention. In the rest of this document, the later convention will be used.

B. RLL (Run Length Limited) Codes

Probably the most commonly used RLL coding scheme is referred to as the (d, k) coding scheme, described further below. As noted above, coding schemes are needed for communication and storage systems that use NRZ modulation, which are based on clocked circuits. In order to map the modulated quantity to binary data, one needs to sample the modulated quantity at regular periodic intervals in time. An internal clock determines these sampling points. Due to practical limitations, the internal clock usually has some error (in clock period). The clock error causes the difference between the points in time at which the signal is to be sampled versus the points in time at which the signal is actually sampled to increase with time. This phenomenon is referred to as clock drift. This problem is typically accommodated by means of a phased lock loop that resynchronizes the internal clock with the NRZ modulated signal every time there is a transition in the modulated quantity.

To ensure proper functioning of the clock circuit, constraints are placed on the binary sequence in order to ensure that there will be at least one transition within some fixed period of time. Such constraints can be characterized as limiting the maximum number of zeros (represented by "k" in the (d, k) coding scheme) between any two adjacent ones. Other engineering constraints may also force a limitation on the minimum number of zeros (represented by "d") between two adjacent ones. The RLL codes are one coding mechanism for mapping arbitrary binary sequences to longer sequences that satisfy the constraints mentioned above in a unique and efficient manner. Because the mapping (encoding) is unique, an inverse of the code is used for decoding. In this way, the original binary data can be recovered.

One scheme used in the context of magnetic data storage is referred to as a (2, 7) RLL code, because the coding scheme ensures that any consecutive data one bits in an unconstrained (input) signal are mapped to a sequence in which adjacent one bits are separated by at least two zero bits, but no more than seven consecutive zero bits. Thus, the set of permissible time intervals from one signal transition to the next for the (2, 7) code is the code symbol set S of consecutive integer multiples of a clock period, where S is specified by Table 1:

TABLE 1

$S = \{3, 4, 5, 6, 7, 8\}$

In other words, the minimum number of time intervals from one transition to the next is three, which occurs where data is encoded as the sequence "1001", and the maximum number of time intervals permitted is eight, which occurs where data is encoded as "100000001". A data device employing a (2, 7) code will map the unconstrained (not yet encoded) bits of a data packet to a bit sequence that is constrained in accordance with the (2, 7) code.

All the factors mentioned above influence the design of data transmission systems like optical and wireless transceivers and data storage systems like magnetic and optical disk drives. Most RLL codes map a block of data bits into a fixed number of constrained data bits, such as mapping all combinations of three unconstrained bits into blocks of five bits, comprising a fixed-length-to-fixed-length code. Other known coding schemes provide a variable length to fixed block code, or block to variable coding length code.

The RLL coding schemes typically under-utilize available bandwidth in most data channels in use today. The RLL coding scheme recognizes that if two consecutive 1's in an input (unconstrained) sequence are encoded into a constrained sequence in which the 1's are too close together, the two 1's will merge and will be read or interpreted as a single one bit rather than two.

The conventional specification of RLL codes establishes the (d, k) parameters so as to stop coding the constrained sequence at the first sign of ambiguity. For example, the (2, 7) RLL code is established in view of the fact that, in the data channel for which the (2, 7) RLL code is intended, seven consecutive zero bits can be resolved successfully, but eight bits cannot. That is, the conventional (2, 7) RLL code is specified in terms of a resolution ambiguity parameter that permits consecutive 0's in the constrained sequence only until the first ambiguity in resolving the zero bits is reached. This is the k value in the (d, k) scheme. The (2, 7) RLL code and similar coding schemes cannot take advantage of the fact that, even if eight consecutive zero bits cannot be resolved successfully, it might be possible that nine or ten or other numbers of consecutive bits greater than eight could be resolved successfully. Thus, there is additional unused capacity in the data channel that cannot be exploited by the conventional coding schemes.

From the discussion above, it should be apparent that there is a need for coding schemes that more fully utilize capacity in a data channel. The present invention satisfies this need.

SUMMARY

In accordance with the invention, data is encoded and decoded for a data channel in accordance with a coding scheme in which a sequence of unconstrained input binary symbols, such as 1's and 0's, is encoded into a representation according to an alphabet comprising allowable time intervals between adjacent input binary symbols according to a precision parameter p, a minimum resolution parameter $\alpha$, and resolution restriction functions L(t) and R(t), thereby defining a precision-resolution (PR) constrained code, and is modulated into an output signal comprising a waveform having signal peaks corresponding to the representation and separated according to the PR-constrained code for transmission of the output signal over the data channel. In this discussion, the minimum resolution parameter is denoted as a and is not limited to integer values. The resolution restriction functions L(t) and R(t) can be additive or multiplicative or a combination of both. The precision parameter is denoted as p and is a function of clock precision for the data channel.

Methods and devices for modulating data for transmission over a data channel can include processors that execute machine executable instructions comprising a set of processing rules that are performed by the processor to implement a data encoder that processes unconstrained data comprising a sequence of data bits and maps the unconstrained data onto a modulation coding scheme for encoding data comprising an unconstrained sequence of input binary symbols into a representation according to an alphabet comprising allowable time intervals between adjacent input binary symbols according to a precision parameters, a minimum resolution parameter a, and resolution restriction functions L(t) and R(t), thereby defining a precision-resolution (PR) constrained code, and modulating an output signal comprising a waveform having signal peaks corresponding to the representation and separated according to the PR-constrained code for transmission of the output signal over the data channel, and wherein the data storage further contains a set of processing rules performed by the processor to implement a data decoder that processes constrained data and detects a modulated waveform having signal peaks that are separated according to the PR-constrained code and quantizing time intervals between the signal peaks so as to produce a representation in accordance with the representation alphabet; and decodes the representation and producing the unconstrained sequence of input binary symbols.

In addition, suitable alphabets for the representation of input binary symbols can be produced by processors that execute machine executable instructions comprising a set of processing rules that are performed by the processor to implement a precision resolution (PR) coding scheme, wherein the executable instructions cause the processor to perform operations comprising receiving channel specification parameters comprising a transmitter precision parameter p and a receiver resolution parameter $\alpha$ for transmission over a data channel in accordance with a target channel capacity, producing combinations of precision and resolution specifications to achieve the target channel capacity, determining a set of allowable time intervals between modulation peaks for a set of data channel symbols, and determining a translation scheme for encoding and decoding of binary symbols for transmission over the data channel. The coding scheme can also be specified in accordance with a resolution factor $\theta$.

Other features and advantages of the present invention should be apparent from the following description of the preferred embodiments, which illustrate, by way of example, the principles of the invention.

DETAILED DESCRIPTION

Figure 1A:
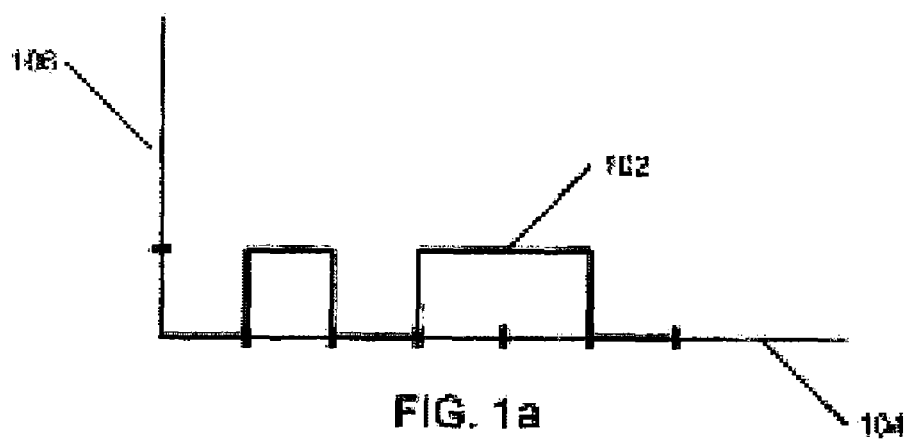
FIG. 1a is a plot of a non-return to zero (NRZ) data signal.
Figure 1B:
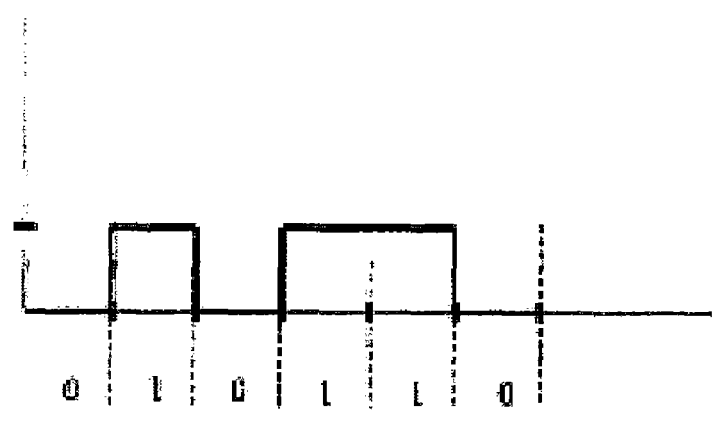
FIG. 1b shows how binary data can be represented using the convention that one state encodes a logical one and the other state encodes a logical zero.
Figure 1C:
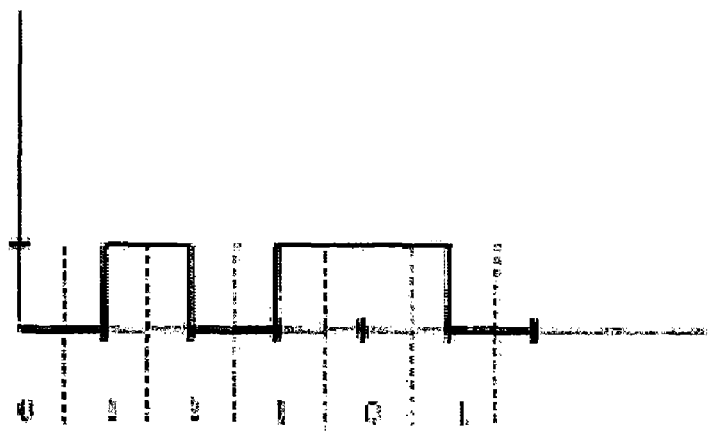
FIG. 1c shows how binary data can be represented using the convention that presence of a transition encodes a logical one and the absence of a transition encodes a logical zero.

Arguably, the most famous constrained system is the (d,k)-RLL (Run-Length Limited) coding scheme, in which a stream of bits obeys the constraint that every two consecutive 1's in an unconstrained input sequence are separated by at least d number of 0's in the constrained output, and there are no more than k consecutive 0's anywhere in the stream. As noted above, the motivation for this coding scheme comes from the fact that certain sensor characteristics restrict the minimum time between adjacent 1's or else the two will be merged in the data receiver, while a clock drift between transmitter and receiver may cause spurious 0's or missing 0's at the receiver if too many appear consecutively.

In this description, under Section I "Introduction" below, we revisit the rationale for the RLL system and reevaluate its relationship to the physical media. As a result, we introduce a new paradigm that better matches the physical constraints. We call the new paradigm the Precision-Resolution (PR) coding system, where the write operation is limited by precision and the read operation is limited by resolution.

In Section II, "The (1, α, θ)-PR Constraint" below, we compute the capacity of a general PR system and demonstrate that it provides a significant increase in the information density compared to the traditional RLL system (for identical physical limitations). For example, the capacity of the (2, 10)-RLL used in CD-ROMs and DVDs is approximately 0.5418, while our PR system provides the capacity of about 0.7725, resulting in a potential increase of 40% in information density.

In Section III, "The General (p, α, θ)-PR Constraint" below, a more general framework for constrained systems will be described, which shall be referred to as the precision-resolution (PR) constrained system. In PR systems, the encoder has precision constraints, while the decoder has resolution constraints. We examine the capacity of PR systems and show the gain in the presence of a high-precision encoder (thus, we place the PR system with integral encoder, (p=1, α, θ)-PR, which turns out to provide a coding scheme that complies with RLL, and the PR system with infinite-precision encoder, (∞, α, θ)-PR, on two ends of a continuum). We derive an exact expression for their capacity in terms of the precision p, the minimal resolvable measurement at the decoder α, and we describe the decoder resolution factor θ. In an analogy to the RLL terminology these are the clock precision, the minimal time between peaks, and the clock drift. Surprisingly, even with an infinite-precision encoder, the capacity is finite.

In Section IV, "Generalization and Optimality" below, we discuss application to other symbol alphabets and optimality conditions. In Section V, "Results Summary" below, we provide additional thoughts on the (p, α, θ)-PR coding scheme presented herein. In Section VI, "Applications and Embodiments" below, we discuss some of the ways in which the present invention can be applied to computing machines and devices.

I. Introduction

The (d, k)-RLL is perhaps the most commonly used constrained system, appearing in various contexts and applications, including (but not restricted to) magnetic and optical storage, holographic storage, and wireless and fiber-optic communication. It is however easy to forget that RLL coding is but one possible solution to a set of restrictions imposed by the medium, by current technology, or by our own choice. To better understand any extension to it, we should first describe these restrictions.

In the context of data storage applications, for example, one wants to write a sequence of bits to represent data. Due to the nature of the recording devices, when reading back the bit sequence, we receive a series of analog peaks that correspond to the 1's in the original bit sequence. The first restriction imposed by such a system is a function of the sensors used for the reading, which may cause adjacent peaks to merge if these are positioned too close to each other in the sequence. In the RLL constraint, this restriction is upheld by requiring that in the bit sequence we write, every two adjacent 1's are separated by at least d=0 consecutive 0's.

On the other hand, the decoding mechanism attempts to acquire the correct number of 0's in a sequence by measuring the time between two peaks, and dividing the time by the duration of a single 0. Since no two clocks are exactly the same, the difference in their respective frequencies causes a drift. If this drift is bounded by $0<\delta<1$, then a written sequence or run of 0's of duration $t \in R$, may actually end up being decoded as a run of duration $(1-\delta)t<t'<(1+\delta)t$. It should be apparent that, the longer the run of 0's, the more spurious or missing 0's may occur in the decoding. To avoid such a problem, the RLL-constraint chooses to limit the maximum length of any run of 0's to k, where $k \in N$ is the largest integer for which $(1+\delta)k \leq (1-\delta)(k+1)$. We note that since the 1's are used only to punctuate the bit sequence, and we measure the time duration between peaks, the duration of the run includes the duration of the consecutive 0's and the single following 1. Thus, for example, any value of $$\delta \in \left(\frac{1}{23}, \frac{1}{21}\right]$$

results in k=10 found in the (2, 10)-RLL specification for CD-ROMs and DVDs.

Hence, in order to get a correct decoder's resolution, we need make sure the corresponding (d, k) constraints are satisfied. However, current RLL systems include an unnecessary implicit restriction: the requirement that the set of valid intervals form a sequence of consecutive integers. Having similar motivation, Funk (see Funk, P., *IEEE Trans. on Magnetics*, vol. MAG-18, no. 2, pp. 772-775, (March 1982)) devised an improvement to the RLL scheme called RLL-MS, by replacing this requirement with another equally arbitrary requirement that the set of valid intervals form an arithmetic progression. The interval-modulation scheme introduced by Mukhtar and Bruck (see Mukhtar, S. et al., *Interval modulation coding*, "Paradise Laboratory, California Institute of Technology, Tech. Rep. ETR040" [Online], available at: http://www.paradise.caltech.edu/papers/etr040.pdf (October 2001) (hereafter ETR040 report); see also Mukhtar S. et al., *Proceedings of the* 2002 *IEEE International Symposium on Information Theory, ISIT2002, Lausanne, Switzerland*, p. 327 (June 2002)) generalized RLL to take advantage of higher precision clocks, however, it mainly addressed the encoder/decoder constructions. See also U.S. Pat. No. 7,129,863 to Mukhtar and Bruck.

Figure 2:
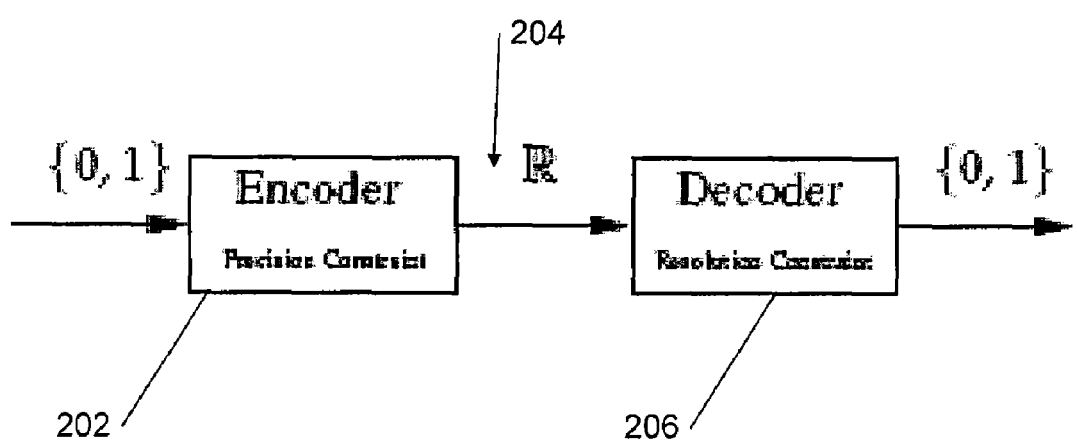
FIG. 2 is a representation of a framework with an encoder, constructed in accordance with the present invention.

Parting ways with the restriction that the time between adjacent peaks must be an integer and parameterizing this precision constraint leads us to define a sequence of ever more precise systems. These systems are able to measure small discrete time intervals, and in the theoretical limit, reach a system with infinite-precision measurement. One benefit in our new paradigm is the separation between the encoder constraints (which relate to the precision of writing information into the physical media) and the decoder constraints (which relate to the ability to distinguish between two different signals received by reading the physical media). This separation is illustrated in FIG. 2.

We therefore introduce the (p, α, θ)-PR (precision-resolution),framework. FIG. 2 is a representation of a framework 200 and shows that an encoder 202 receives a sequence or stream of binary symbols, transforms them into a stream of real numbers that are sent over a noiseless channel 204 to a decoder 206, which then converts them back to the original binary sequence of binary symbols. However, both sides of the channel must comply with further constraints:

Encoder Constraint—The encoder has constrained precision. Each transmitted symbol $t \in Q$ is some $t=m/p$ where m, $p \in N$, m any integer, and p a fixed integer. We call p the precision of the encoder. We denote infinite precision by $p=\infty$, i.e., the framework in which the encoder can send any $t \in R$.

Decoder Constraints—The decoder has resolution constraints. We may define several different sets of constraints which correspond to different applications. In this paper we consider a set which is motivated mainly (but not only) by storage applications.

The decoder cannot correctly recover any $t<\alpha$, where $\alpha \in R$, $\alpha>0$, where α is called the minimum resolution.

If $t \in R$ was transmitted, then the received $t' \in R$ obeys $(1-\delta)t<t'<(1+\delta)t$, where $\delta \in R, 0<\delta<1$, is another parameter of the framework, where δ relates to clock drift between two exemplary devices communicating over the data channel. For convenience, we define $$\theta = \frac{1+\delta}{1-\delta}$$

and call it the resolution factor. As will be explained below the θ is a convenient expression for the resolution functions L(t), R(t) for the data channel, which will be familiar to those skilled in the art without further explanation.

We note that the RLL constraint is but one solution to a precision-resolution framework. In the following sections we will present the precision-resolution constraint which has a higher capacity than its RLL and RLL-MS counterparts.

In his seminal work, Shannon (Shannon, C. E., *Bell System Technical Journal*, 27:379-423 (July 1948)) defined the capacity of a constrained system S as $$\text{cap}(S) \stackrel{\text{def}}{=} \lim_{n \to \infty} \frac{\log_2|S(n)|}{n},$$

where S(n) n∈N, denotes the set of strings of length n in S. Further advances in the subject include the work of Adler, Coppersmith, and Hassner (Adler, R. L. et al., *IEEE Trans. on Inform. Theory*, 29:5-22 (1983)), who applied symbolic dynamics (Lind, D. et al., *An Introduction to Symbolic Dynamics and Coding*. Cambridge University Press (1985)) to the analysis and construction of sliding-block encoders for constrained systems. More extensions may be found in works such as Heegard, Marcus, and Siegel (Heegard, C. D., et al. *IEEE Trans. on Inform. Theory*, 37:759-777 (1991)), Marcus, Siegel, and Wolf (Marcus, B. H. et al., *IEEE J Select. Areas Commun.*, 10:5-37 (January 1992)), and a review in Marcus, Roth, and Siegel (Marcus, Brian H., *Constrained systems and coding for recording channels*.; V. S. Pless and W. C. Huffman (Editors), Elsevier, Amsterdam (1998)).

Since the definition of the RLL constraint (see, e.g., Kautz, W. H., *IEEE Trans. on Inform. Theory*, IT-11:284-292 (April 1965); Tang, D. T., *Inform. and Control*, 17:436-461 (December 1970)), several variants to the RLL constraint were suggested. However, the basic premise that we may use ever growing runs of 0's until we reach a run length for which the clock drift may produce a spurious 0, was never changed. This paradigm was shifted in the work of Mukhtar and Bruck (ETR040 report cited above; Mukhtar S. et al., *Proceedings of the 2002 IEEE International Symposium on Information Theory*, ISIT2002, Lausanne, Switzerland, page 327, (June 2002)), which described an extension to the RLL constraint and gave a variable-bit-rate to variable-bit-rate encoder/decoder scheme for it. In Section II, we describe this extension in the precision-resolution framework, discuss the integral-precision constraint, (1, α, θ)-PR, and calculate its capacity. In Section III we consider the sequence of constraints (p, α, θ)-PR, where p=1, 2, ..., and show how it gives a significant improvement to the capacity while the RLL constraint fails. We then find the capacity of the infinite-precision constraint, (∞, α, θ)-PR, and show that it is actually the limit as p→∞ of the capacity of (p, α, θ)-PR. As a result, we can compare, for example, the capacity of (2, 10)-RLL used in CD-ROMs and DVDs and is approximately 0.5418, with the capacity of the corresponding (∞, 3, 1.1)-PR which is approximately 0.7725, thus giving the hope for an increase in capacity of more than 40% in this case. We discuss generalizations to the PR scheme with higher alphabets as well as different resolution constraints in Section IV, and show that under a reasonable set of assumptions, our greedy interval packing is optimal. We summarize our results in Section V.

II. The (1, α, θ)-PR Constraint

The (d, k)-RLL constrained system is, equivalently, the set of all possible strings which are formed by concatenating strings from the set $$S_{d,k} \stackrel{\text{def}}{=} \{0^d 1, 0^{d+1} 1, 0^{d+2} 1, \ldots, 0^k 1\}.$$

Because of this form of representation, it was shown in Shannon, C. E., *Bell System Technical Journal*, 27:379-423 (July 1948), that the capacity of the (d, k)-RLL constraint is $\log_2 r_{d,k}$, where $r_{d,k} \in P$ is the unique positive root of the equation $$x^{-(d+1)} + x^{-(d+2)} + x^{-(d+3)} + \ldots + x^{-(k+1)} = 1.$$

We may also think of the strings in $S_{d,k}$ as a set of symbols which differ only in their duration. For (d, k)-RLL this set is $$\hat{I}_{d,k} \stackrel{\text{def}}{=} \{d+1, d+2, \ldots, k+1\}.$$

For the decoder of a (d, k)-RLL stream there is no ambiguity. Any time duration read t', is some $(1-\delta)t<t'<(1+\delta)t$, where $t \in \hat{I}_{d,k}$ is the written duration and $0<\delta<1$ is the clock drift. But since k was chosen such that $(1+\delta)k \leq (1-\delta)(k+1)$, for any two distinct elements $t_1, t_2 \in \hat{I}_{d,k}$ there is no intersection in their $\delta$-neighborhoods: $((1-\delta)t_1, (1+\delta)t_1)$ and $((1-\delta)t_2, (1+\delta)t_2)$.

Essentially, the (d, k)-RLL constraint starts with the minimal time interval allowed by the decoder, d+1, and continues to add successive lengths d+2, d+3, . . . and so forth as long as their $\delta$-neighborhoods are disjoint. It stops at the first length k+1 whose $\delta$-neighborhood intersects that of k+2.

A question asked by Mukhtar and Bruck (see ETR040 report cited above), is why restrict ourselves to successive time durations? We may need to skip k+2 but still be able to use k+3 or k+4 or some other longer length. In the ETR040 report, it is assumed that some digital clock is governing the system, thus restricting all time durations measured to be integral multiples of the clock period. This brings us to define the integral precision-resolution constrained system.

Definition 1. Let $\alpha \in R$, $\alpha > 0$, be the minimum resolution, and let $$\theta = \frac{1+\delta}{1-\delta} > 1$$

be the resolution factor, where $\delta \in R$, $0<\delta<1$. Then the $(1, \alpha, \theta)$-PR constraint is the set of all streams with symbols from the set $$\hat{I}_{\alpha,\theta} \stackrel{def}{=} \{\lceil \alpha, \theta \rceil^i | i = 0, 1, 2, \ldots \} \subset N$$

where we define $$\lceil \alpha, \theta \rceil^i \stackrel{def}{=} \lceil \ldots \lceil \lceil \lceil \alpha \rceil \theta \rceil \overline{\theta \rceil \ldots \theta \rceil}^i$$

where $\lceil \ \rceil$ is the well-known ceiling function.

Example 2. For $\alpha = 2$ and $\theta = 1.5$, we have
$\hat{I}_{\alpha,\theta} = \{2, 3, 5, 8, 12, 18, 27, \ldots\}$.

Figure 3:
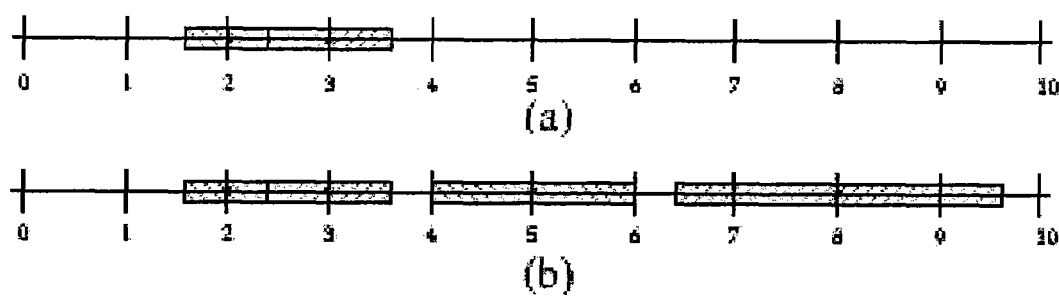
FIG. 3 is a graphical representation of disjoint $\delta$-neighborhoods.

See FIG. 3 for an illustration of the disjoint $\delta$-neighborhoods for exemplary values. With $\alpha = 2$ and $\theta = 1.5$ (i.e., $\delta = 0.2$), FIG. 3(a) shows the disjoint neighborhoods in the (1,2) RLL coding scheme comprising symbols $\{2, 3\}$, showing that they are adjacent but distinct. FIG. 3(b) shows the disjoint neighborhoods for the first four symbols in the (1, 2, 1.5) PR coding scheme in accordance with the present invention, comprising symbols $\{2, 3, 5, 8\}$.

Thus, in accordance with the PR-constraint described herein, the available symbols for the coded binary sequence are not restricted to consecutive integers (compare, for example, Table 1 above for a (d, k) RLL code). In this way, the PR-constraint of the present invention provides a greater number of available symbols (i.e., coding alphabet) as compared with the conventional RLL coding schemes.

It should be apparent that the $(1, \alpha, \theta)$-PR constraint obeys the $(1, \alpha, \theta)$-PR framework since all symbols are integers, the smallest one is $\alpha$, and $$\lceil \alpha, \theta \rceil^{i+1} = \lceil \theta \lceil \alpha, \theta \rceil^i \rceil \geq \theta \lceil \alpha, \theta \rceil^i$$

ensures that the $\delta$-neighborhoods of elements in $\hat{I}_{\alpha,\theta}$ are disjoint. For a practical implementation it might be desirable to limit the size of elements in $\hat{I}_{\alpha,\theta}$ and so we define $$\hat{I}_{\alpha,\theta}^m \stackrel{def}{=} \{\tau \in \hat{I}_{\alpha,\theta} \mid \tau \leq m\}.$$

Furthermore, if we define $$k_\theta = \max\{k \in Z | \theta(k-1) \leq k\},$$

then $\hat{I}_{\alpha,\theta}^{k_\theta}$ is exactly the set used in $(\lceil \alpha \rceil - 1, k_\theta - 1)$-RLL.

The discussion above should make it apparent that it is not necessary to use all the possible allowable intervals (i.e., the available alphabet) in the PR coding scheme. The entire number of alphabet symbols available in accordance with the PR coding scheme can be infinite. Those skilled in the art will appreciate that the law of diminishing returns will apply as additional alphabet symbols are added. The desired subset of all available alphabet symbols can be specified in accordance with a variety of translation schemes. See, for example, the symbol specification technique described in the ETR040 report above.

We can next show that the greater number of symbols in the coding alphabet as a result of the PR constraint will provide a greater channel capacity.

Theorem 3. Let $\hat{S}_{\alpha,\theta}^m$ denote the constraint with intervals from $\hat{I}_{\alpha,\theta}^m$. Then for every $m < m'$ such that $|\hat{I}_{\alpha,\theta}^m| < |\hat{I}_{\alpha,\theta}^{m'}|$, $$\text{cap}(\hat{S}_{\alpha,\theta}^m) < \text{cap}(\hat{S}_{\alpha,\theta}^{m'}) < 1.$$

Proof. As was pointed out before, $\text{cap}(\hat{S}_{\alpha,\theta}^m) = \log_2 \hat{r}_m$ where $\hat{r}_m$ is the unique positive solution to the equation $\hat{f}_m(x) = 1$, and $$\hat{f}_m(x) \stackrel{def}{=} \sum_{\tau \in \hat{I}_{\alpha,\theta}^m} x^{-\tau}.$$

Similarly we define $\hat{r}_{m'}$ and $\hat{f}_{m'}(x)$, where the latter is easily seen to be monotone decreasing and continuous in $(0, \infty)$. Since $\hat{f}_{m'}(2) < 1$ we immediately get that $\text{cap}(\hat{S}_{\alpha,\theta}^{m'}) < 1$. Furthermore, $$\hat{f}_{m'}(\hat{r}_m) = \sum_{\tau \in \hat{I}_{\alpha,\theta}^{m'}} \hat{r}_m^{-\tau} = 1 + \sum_{\tau \in \hat{I}_{\alpha,\theta}^{m'} \setminus \hat{I}_{\alpha,\theta}^m} \hat{r}_m^{-\tau} > 1,$$

and so $\text{cap}(\hat{S}_{\alpha,\theta}^m) < \text{cap}(\hat{S}_{\alpha,\theta}^{m'})$.

We therefore conclude that adding more symbols to the constraint strictly increases the capacity. If we consider the infinite set $\hat{I}_{\alpha,\theta}$, we get the following theorem.

Theorem 4. Let $\hat{S}_{\alpha,\theta}$ denote the $(1, \alpha, \theta)$-PR constrained system. Then $$\text{cap}(\hat{S}_{\alpha,\theta}) = \log_2 \hat{r}_{\alpha,\theta} < 1$$

where $\hat{r}_{\alpha,\theta}$ is the unique solution in $(1, \infty)$ to the equation $\hat{f}_{\alpha,\theta}(x) = 1$ and $$\hat{f}_{\alpha,\theta}(x) \stackrel{def}{=} \sum_{i \geq 0} x^{-\lceil \alpha, \theta \rceil^i}.$$

Proof. We omit the proof that $\text{cap}(\hat{S}_{\alpha,\theta}) = \log_2 \hat{r}_{\alpha,\theta}$ since this is essentially the same as the proof of Theorem 4. From that proof we also get that $\hat{f}_{\alpha,\theta}(x)$ is continuous and monotone decreasing in $(1, \infty)$. We now note that all the exponents in $\hat{f}_{\alpha,\theta}(x)$ are positive integers, and since $\theta>1$, not all positive integers appear as exponents. Thus, $\hat{f}_{\alpha,\theta}(2)<1$ and so $\text{cap}(\hat{S}_{\alpha,\theta})=\log_2 \hat{r}_{\alpha,\theta}<1$.

Figure 4:
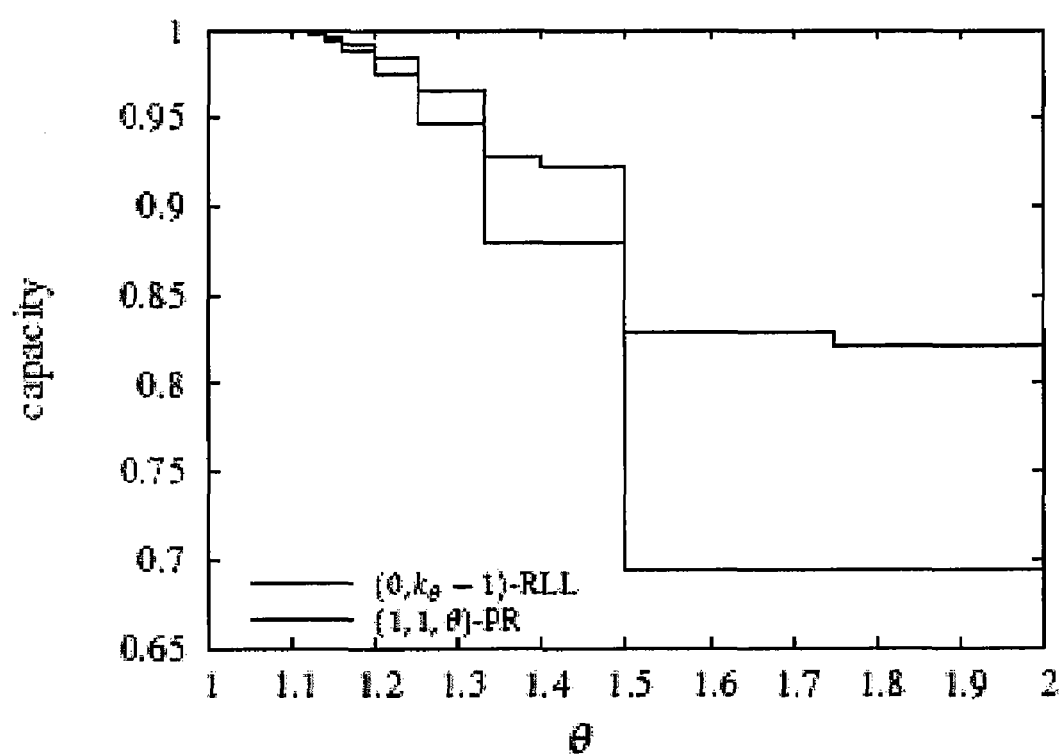
FIG. 4 is a graphical representation of the encoder parameter $\theta$ against the encoder capacity.

We see in FIG. 4, for $1<\theta\leq 2$, a comparison of the resulting $(0, k_\theta-1)$-RLL constraint with its extension, the $(1, 1, \theta)$-PR constraint. To plot this graph, an approximation was needed since no simple closed form is known for $\hat{f}_{\alpha,\theta}(x)$. Specifically, we added only the first five monomials beyond those of the corresponding RLL constraint. Thus, FIG. 4 shows the comparative capacity for the $(0, k_\theta-1)$-RLL coding scheme and the $(1, 1, \theta)$ PR coding scheme in accordance with the invention.

III. The General $(p, \alpha, \theta)$-PR Constraint

It should be intuitively clear that the rounding up of the symbols of the $(1, \alpha, \theta)$-PR constraint incurs a penalty in capacity, especially for small values of $\theta$. So while the $\delta$-neighborhoods of $\lceil\alpha\rceil$ and $\lceil\lceil\alpha\rceil\theta\rceil$ are disjoint, the unused gap between them might be fairly large.

All of this is caused by the fact that we restricted ourselves to symbols that are integers or, more specifically, integer multiples of a clock frequency for the data channel. But suppose we are given a system which is $p \in N$ times more precise, i.e., it is able to transmit symbols which are multiples of $1/p$. In practical terms, being p times more precise means the encoder has a clock with p times the original frequency, which allows it to align the peaks to multiples of $1/p$. This does not mean that the encoder writes more densely since the decoder's minimum resolution does not depend on the precision p. So now, instead of rounding up the symbols of our constrained system to the nearest integer, we can round them up to the nearest multiple of $1/p$.

Definition 5. Let $p \in N$ be the precision $\alpha \in R$, $\alpha>0$, be the minimum resolution, and let $$\theta = \frac{1+\delta}{1-\delta} >$$

be the resolution factor, where $\delta \in R$, $0<\delta<1$. Then the $(p, \alpha, \theta)$-PR constraint is the set of all streams with symbols from the set $$\hat{I}_{p,\alpha,\theta} \overset{def}{=} \left\{ \frac{\lceil p\alpha, \theta \rceil^i}{p} \,\middle|\, i = 0, 1, 2, \ldots \right\}.$$

Example 6. For $p=2$, $\alpha=2$ and $\theta=1.5$, we have $$\hat{I}_{p,\alpha,\theta} = \{2, 3, 4.5, 7, 10.5, 16, 24, \ldots\}.$$

Figure 5:
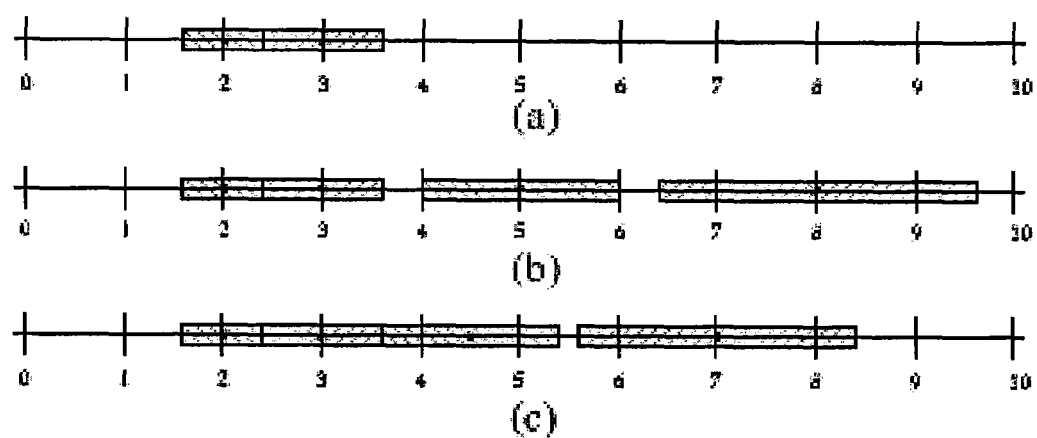
FIG. 5 is a graphical representation of disjoint $\delta$-neighborhoods as precision increases.

See FIG. 5 for an illustration of the disjoint $\delta$-neighborhoods which shows the shrinking of the gap between adjacent neighborhoods as the precision grows. That is, with $\alpha=2$ and $\theta=1.5$ (i.e., $\delta=0.2$), FIG. 5(a) shows the disjoint neighborhoods of a conventional $(1, 2)$ RLL coding scheme limited to consecutive integer symbols, FIG. 5(b) shows the first four symbols of a $(1, 2, 1.5)$ PR constraint coding scheme in accordance with the present invention, and FIG. 5(c) shows the first four symbols of a $(2, 2, 1.5)$ PR constraint coding scheme in accordance with the present invention. Thus, a greater number of symbols is available with the increased precision. Again, we can show that the increased number of available symbols increases the system capacity.

The following theorem shows that we never lose capacity when using a constraint which is p times more precise.

Theorem 7. Let $p \in N$, $\alpha$, $\theta \in R$, $\alpha>0$, $\theta>1$. Then $$\text{cap}(\hat{S}_{1,\alpha,\theta}) \leq \text{cap}(\hat{S}_{p,\alpha,\theta}) = p \cdot \text{cap}(\hat{S}_{1,p\alpha,\theta})$$

which holds in equality iff $p\lceil\alpha,\theta\rceil^i = \lceil p\alpha,\theta\rceil^i$ for all $i\geq 0$.

Proof. First, since the symbols of $(p, \alpha, \theta)$-PR are exactly the symbols of $(1, p\alpha, \theta)$-PR, only scaled down by a factor of p, there is a 1–1 correspondence between strings of length n in $(p, \alpha, \theta)$-PR, and strings of length pn in $(1, p\alpha, \theta)$-PR. The length of a string is the sum of the lengths of its symbols, where the length of a symbol is simply its value. The length of a string is the sum of the lengths of its symbols, where the length of a symbol is simply its value. Thus, $$\text{cap}(\hat{S}_{p,\alpha,\theta}) = p \cdot \text{cap}(\hat{S}_{1,p\alpha,\theta}).$$

Let us now define $$\hat{f} = \sum_{i\geq 0} x^{-\lceil\alpha,\theta\rceil^i} \text{ and } \hat{f} = \sum_{i\geq 0} x^{-\lceil p\alpha,\theta\rceil^i}$$

so that $\text{cap}(\hat{S}_{1,\alpha,\theta}) = \log_2 \hat{r}$ and $\text{cap}(\hat{S}_{1,p\alpha,\theta}) = \log_2 \hat{r}_p$, where $\hat{r}, \hat{r}_p \in R$ are the unique positive solutions to $\hat{f}(x) = \hat{f}_p(x) = 1$ respectively.

We note that $\hat{f}(x^p) \leq \hat{f}_p(x)$ for all $x>1$. This is because $p \in N$, so for any $\beta \in R$, $\beta>0$, we get $p\lceil\beta\rceil \geq \lceil p\beta\rceil$ and thus $x^{-p\lceil\alpha,\theta\rceil^i} \leq x^{-\lceil p\alpha,\theta\rceil^i}$. Thus, $\hat{f}(r_p^p) \leq \hat{f}_p(r_p) = 1$, and since $\hat{f}(x)$ is continuous and monotone decreasing in $(1, \infty)$, this means that $$\text{cap}(\hat{S}_{1,\alpha,\theta}) \leq p \cdot \text{cap}(\hat{S}_{1,p\alpha,\theta}).$$

Finally, since $x^{-p\lceil\alpha,\theta\rceil^i} \leq x^{-\lceil p\alpha,\theta\rceil^i}$, equality holds in the above iff $p\lceil\alpha,\theta\rceil^i = \lceil p\alpha,\theta\rceil^i$ for all $i\geq 0$.

Figure 6:
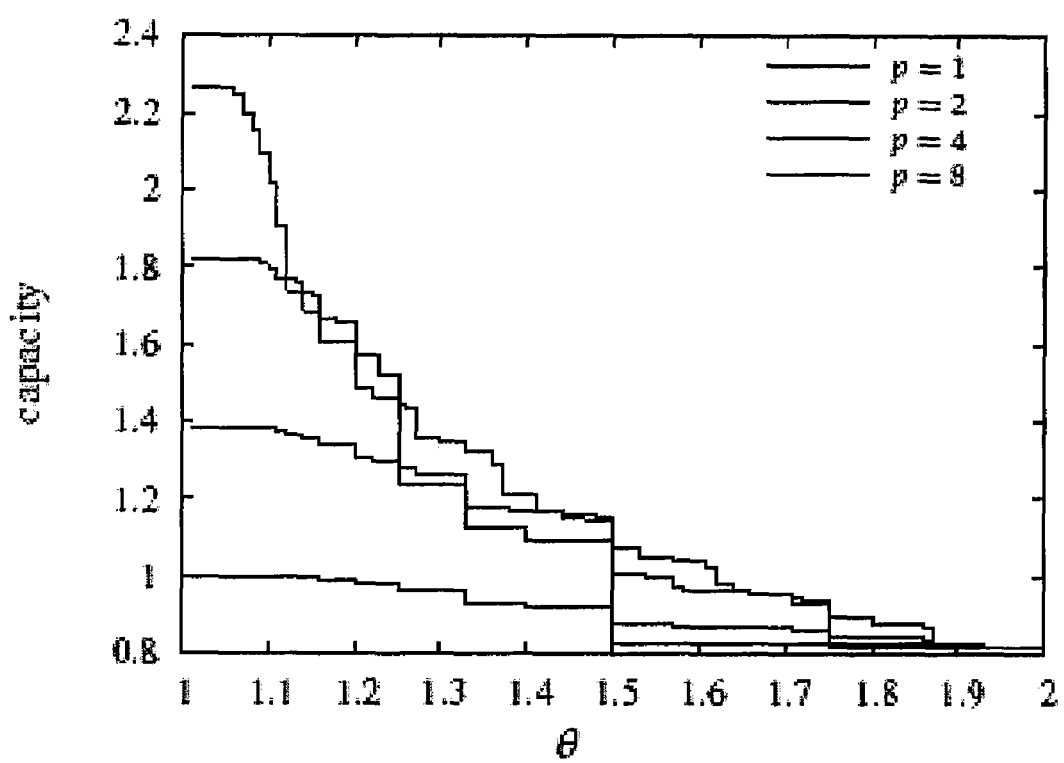
FIG. 6 is a graphical representation of the encoder parameter $\theta$ against the encoder capacity.

We note that the requirement that p be an integer is necessary for Theorem 7. This is because for $\mu, \beta \in R$, and $\mu, \beta$, and $\mu, \beta>0$, we do not know which of $\mu\lceil\beta\rceil$ and $\lceil\mu\beta\rceil$ is greater. Thus, for example, there are values of $\theta$ for which we get $\text{cap}(\hat{S}_{2,1,\theta}) > \text{cap}(\hat{S}_{3,1,\theta})$. In FIG. 6, we see $\text{cap}(\hat{S}_{p,1,\theta})$ for p $\{1, 2, 4, 8\}$.

Returning to the RLL constraint, being p times more precise usually translates into having a digital clock that runs p times faster than was specified for the data channel in accordance with a coding scheme, such as a $(d, k)$-RLL coding scheme. While we gain from faster clocks after establishing a channel coding specification when using $(p, \alpha, \theta)$-PR, the case is often worse in $(d, k)$-RLL. This is because when using a clock which runs p times faster, we have to use $(p(d+1)-1, k)$-RLL since k is not affected by the speed of the clock, but the minimum time between adjacent peaks becomes $p(d+1)$ clock ticks. However, we have $p \cdot \text{cap}(S_{p(d+1)-1,k}) = 0$ when $p(d+1)-1 \geq k$, which for most practical values of p, d, and k, is the case.

If we look at FIG. 6, there appears to be an upper bound on the capacity as we continue to increase the precision. This is indeed the case as will shall prove shortly. First, we define the appropriate constrained system with infinite-precision. That is, for digital data channels, a theoretical limit of infinity exists for the precision parameter, and for analog data channels, the precision can be represented by infinity. Such considerations lead to a definition for a PR coding scheme with infinite precision:

Definition 8. Let $\alpha \in R$, $\alpha>0$, be the minimum resolution, and let $$\theta = \frac{1+\delta}{1-\delta} > 1$$

be the resolution factor, where $\delta \in R$, $0<\delta<1$. Then the $(\infty, \alpha, \theta)$-PR constraint is the set of all streams with symbols from the set $$I_{\alpha,\theta} \stackrel{def}{=} \{\alpha\theta^i \mid i = 0, 1, 2\ldots\} \subset R.$$

Example 9. For $\alpha=2$ and $\theta=1.5$, we have $$I_{\alpha,\theta}=\{2, 3, 4.5, 6.75, 10.125, 15.1875, 22.78125, \ldots\}.$$

It should be apparent that the infinite precision definition provides an alphabet for the representation of input binary symbols comprising I (Definition 8) that include non-integer numbers (i.e., real numbers). Such non-integer values, such as 4.5 and 6.75, can be represented in a digital data channel by multiple clock intervals of an increased frequency clock. For example, for a data channel specification that contemplates a clock having a nominal frequency f, the alphabet values 4.5 and 6.75 could be implemented with an increased-frequency system clock having a frequency of 4f, so that the value 4.5 would be implemented by eighteen intervals of the increased frequency clock and the value 6.75 would be implemented by twenty-seven intervals. It should be apparent that the other alphabet values would be implemented by corresponding clock multiples, such as the value 2 being implemented by eight clock intervals, and so forth.

Figure 7:
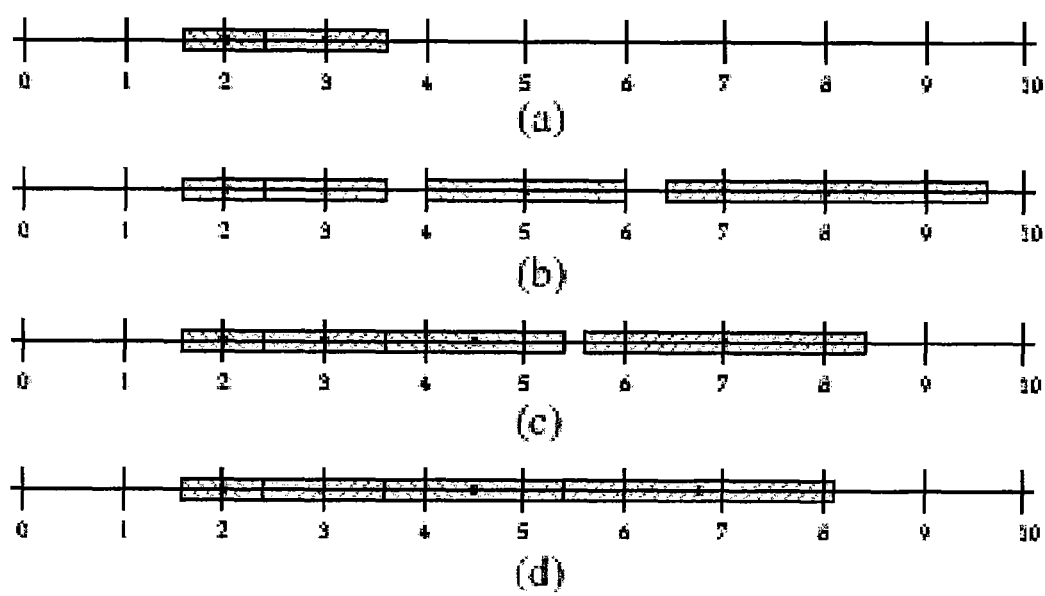
FIG. 7 is a graphical representation of disjoint $\delta$-neighborhoods as precision increases to infinity.

See FIG. 7 for an illustration of the disjoint $\delta$-neighborhoods which shows the total elimination of the gaps between adjacent neighborhoods with infinite precision. In particular, with $\alpha=2$ and $\theta=1.5$ (i.e., $\delta=0.2$), FIG. 7(a) shows the disjoint neighborhoods of a conventional (1, 2) RLL coding scheme limited to consecutive integer symbols, FIG. 7(b) shows the first four symbols of a (1, 2, 1.5) PR constraint coding scheme in accordance with the present invention, FIG. 7(c) shows the first four symbols of a (2, 2, 1.5) PR constraint coding scheme in accordance with the present invention, and FIG. 7(d) shows the first four symbols of a $(\infty, 2, 1.5)$ PR constraint coding scheme in accordance with the present invention. Thus, a greater number of symbols is available with the increased precision having an effective value of $\infty$. That is, the value of the precision parameter p approaches a theoretical limit of $\infty$. As before, it is possible to show that the increased number of available symbols increases the system capacity.

Since an $(\infty, \alpha, \theta)$-PR system is no longer made up of discrete bits, we need the analog of length n strings. We define the $\tau$-header, $\tau \in R$, of such a stream, as the ordered set of symbols appearing between the beginning of the stream and time $\tau$. If we observe the $\tau$-header, we may see several symbols encoded in it one after the other. The last complete symbol may not necessarily reach time $\tau$ exactly. The remaining part of the time interval is the beginning of another encoded symbol whose end we do not see, and which we call the tail.

Example 10. For $\alpha=1$, $\theta=1.5$ the allowed symbols are of duration $1=\alpha\theta^0$, $1.5=\alpha\theta^1$, $2.25=\alpha\theta^2$, ..., and so on. The following 3-headers may be seen: (1, 1, 1), (1.5, 1.5), (1, 1.5, -), (1.5, 1, -), (1, 1, -), (2.25, -), (1.5,-), (1,-), and (-). The - sign denotes the tail.

We can now proceed with calculating the capacity of the $(\infty, \alpha, \theta)$-PR constraint. For simplicity, we handle the $\alpha=1$ case first, and then prove the general case.

Theorem 11. Let $S_\theta$ denote the $(\infty, 1, \theta)$-PR constrained system, $\theta>1$. Then $$\mathrm{cap}(S_\theta)=\log_2 r_\theta$$

where $r_\theta$ is the unique solution in $(1, \infty)$ to the equation $f_\theta(x)=1$ and $$f_\theta(x) \stackrel{def}{=} \sum_{i \geq 0} x^{-\theta^i}.$$

Proof. The first thing we do is prove that $r_\theta$ actually exists and is unique. For any $x \in (1, \infty)$, the sequence of partial sums $\sigma_j(x)=\sum_{i=0}^{j} x^{-\theta^i}$ is strictly increasing and bounded from above by the geometric sum $$\sum_{i=0}^{\infty} x^{-1-i(\theta-1)} = (x - x^{2-\theta})^{-1}$$

and thus converges. Now let $x \in [a,b] \subset (1, \infty)$ and then $x^{-\theta^i} \leq a^{-\theta^i}$ and since we have already noted that the sequence $\sigma_j(a)$ converges, by the Weierstrass M-test $\sigma_j(x)$ converges uniformly in [a,b] and is therefore continuous. Thus $f_\theta(x)$ is continuous for any $x \in (1, \infty)$ and is easily seen to be strictly decreasing. Finally, since $$\lim_{x \to 1^+} f_\theta(x) = \infty \text{ and } \lim_{x \to \infty} f_\theta(x) = 0$$

there exists a unique $r_\theta$ as required.

Let us denote by $S_\theta(\tau)$ the set of all $\tau$-headers of $S_\theta$. It follows that $$|S_\theta(\tau)| = \begin{cases} 1 + \sum_{i=0}^{\infty} |S_\theta(\tau - \theta^i)| & \tau \geq 0 \\ 0 & \tau < 0 \end{cases}$$

For technical simplicity let us define $\overline{S}_\theta(\tau)$ to be the set of all $\tau$-headers of $S_\theta$ with tail strictly smaller than 1. It is easy to see that $$|\overline{S}_\theta(\tau)| = \begin{cases} \sum_{i=0}^{\infty} |\overline{S}_\theta(\tau - \theta^i)| & \tau \geq 0 \\ 1 & 0 \leq 1 \\ 0 & \tau < 0 \end{cases}$$

Figure 8:
FIG. 8 is a representation of merging and stuffing in the system.
Figure 8:
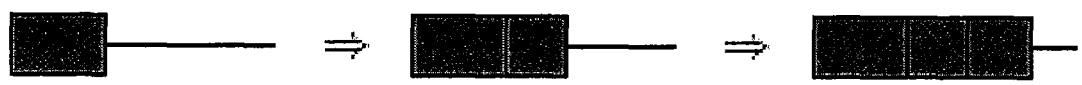

We contend that $|S_\theta(\tau)| \leq \lfloor\tau\rfloor |\overline{S}_\theta(\tau)|$ for $\tau \geq 1$. This is because any $\tau$-header of $\overline{S}_\theta(\tau)$ contains at most $\lfloor\tau\rfloor$ complete symbols, and since its tail is strictly shorter than 1, we can create at most $\lfloor\tau\rfloor$ distinct $\tau$-headers in $S_\theta(\tau)$ by repeatedly merging the tail with the last complete symbol. To complete the argument, we can get any $\tau$-header of $S_\theta(\tau)$ that way because we can take any $\tau$-header with tail of length 1 or more, and repeatedly stuff complete symbols of length 1 while reducing the tail by 1, to get a $\tau$-header from $\overline{S}_\theta(\tau)$. See FIG. 8 for an example of merging and stuffing.

We now prove by induction that $|\overline{S}_\theta(\tau)| \leq r_\theta^\tau$. Though the domain of $|\overline{S}_\theta(\tau)|$ is R, the induction will take place on N. For the induction base we point out that obviously $|\overline{S}_\theta(\tau)|=0 \leq r_\theta^\tau$ for all $\tau \in (-\infty, 0)$ by definition. Furthermore, since $r_\theta>1$, $|\overline{S}_\theta(\tau)|=1 \leq r_\theta^\tau$ for all $\tau \in [0,1)$. For the induction hypothesis, let us assume that $|\bar{S}_\theta(\tau)| \leq r_\theta^\tau$ for all $\tau \in (-\infty, n)$, $n \in N$. We then prove the claim also holds for $\tau \in [n, n+1)$. Let $\tau \in [n, n+1)$, then $$|\bar{S}_\theta(\tau)| = \sum_{i=0}^{\infty} |\bar{S}_\theta(\tau - \theta^i)| \leq \sum_{i=0}^{\infty} r_\theta^{\tau-\theta^i} = r_\theta^\tau \sum_{i=0}^{\infty} r_\theta^{-\theta^i} = r_\theta^\tau$$

where we are able to use the induction hypothesis since $\theta^i \geq 1$ and so $\tau - \theta^i \in (-\infty, n)$. It follows that $$\text{cap}(S_\theta) = \lim_{\tau \to \infty} \frac{\log_2 |S_\theta(\tau)|}{\tau} \leq \lim_{\tau \to \infty} \frac{\log_2 \lfloor \tau \rfloor |\bar{S}_\theta(\tau)|}{\tau} \leq \log_2 r_\theta$$

We now want to prove that $\text{cap}(S_\theta) \geq \log_2 r_\theta$. We contend that $$|\bar{S}_\theta(\tau)| \geq \frac{1}{r_\theta} r_\theta^\tau$$

for all $\tau \geq 0$. We do this again by induction. For the induction base take any $\tau \in [0,1)$ and then $$|S_\theta(\tau)| = 1 \geq \frac{1}{r_\theta} r_\theta^\tau \geq \frac{1}{r_\theta} r_\theta^\tau.$$

For the induction hypothesis we assume that $$|S_\theta(\tau)| \geq \frac{1}{r_\theta} r_\theta^\tau$$

for all $\tau \in [0, n)$, $n \in N$. We prove the claim also holds for $\tau \in [n, n+1)$. Taking $\tau \in [n, n+1)$ it follows that, $$|S_\theta(\tau)| = 1 + \sum_{i=0}^{\infty} |S_\theta(\tau - \theta^i)|$$

$$= 1 + \sum_{i=0}^{\lfloor \log_\theta \tau \rfloor} |S_\theta(\tau - \theta^i)| \geq 1 + \sum_{i=0}^{\lfloor \log_\theta \tau \rfloor} \frac{1}{r_\theta} r_\theta^{\tau - \theta^i}$$

$$= 1 + \sum_{i=0}^{\infty} \frac{1}{r_\theta} r_\theta^{\tau - \theta^i} - \sum_{i=\lfloor \log_\theta \tau \rfloor + 1}^{\infty} \frac{1}{r_\theta} r_\theta^{\tau - \theta^i}$$

$$= \frac{1}{r_\theta} r_\theta^\tau + 1 - \sum_{i=\lfloor \log_\theta \tau \rfloor + 1}^{\infty} \frac{1}{r_\theta} r_\theta^{\tau - \theta^i} \geq \frac{1}{r_\theta} r_\theta^\tau + 1 - \sum_{i=0}^{\infty} \frac{1}{r_\theta} r_\theta^{-\theta^i}$$

$$\geq r_\theta^\tau + 1 - \sum_{i=0}^{\infty} r_\theta^{-i(\theta - 1)} \geq \frac{1}{r_\theta} r_\theta^\tau.$$

Thus we get $$\text{cap}(S_\theta) = \lim_{\tau \to \infty} \frac{\log_2 |S_\theta(\tau)|}{\tau} \geq \log_2 r_\theta$$

which completes the proof.

To translate the capacity of $(\infty, 1, \theta)$-PR to the capacity of $(\infty, \alpha, \theta)$-PR with any $\alpha > 0$, we have the following theorem.

Theorem 12. Let $S_{\alpha,\theta}$ denote the $(\infty, \alpha, \theta)$-PR constrained system, $\alpha > 0$, $\theta > 1$. Then $$\text{cap}(S_{\alpha,\theta}) = \frac{1}{\alpha} \cdot \text{cap}(S_{1,\theta}).$$

Proof. Just observe the simple 1-1 correspondence between $\tau$-headers of $S_{1,\theta}$, and $\alpha\tau$-headers of $S_{\alpha,\theta}$, achieved through simple scaling by a factor of $\alpha$.

The capacity of $(\infty, \alpha, \theta)$-PR is an upper bound on the capacity of any $(p, \alpha, \theta)$-PR, $p \in N$, and is actually the limit as $p \to \infty$. This is shown in the next two theorems.

Theorem 13. For any $p \in N$, $\alpha, \theta \in R$, $\alpha > 0$, $\theta > 1$, let $\hat{S}_{p,\alpha,\theta}$ denote the $(p, \alpha, \theta)$-PR constraint, and $S_{\alpha,\theta}$ denote the $(\infty, \alpha, \theta)$-PR constraint. Then $$\text{cap}(\hat{S}_{p,\alpha,\theta}) \leq \text{cap}(S_{\alpha,\theta}).$$

Proof. Since $\lceil p\alpha, \theta \rceil^i / p \geq \alpha \theta^i$, take any string of length n from $\hat{S}_{p,\alpha,\theta}$, and replace every symbol of duration $\lceil p\alpha, \theta \rceil^i / p$ with a symbol of duration $\alpha \theta^i$ and by extending the tail, getting an n-header from $S_{\alpha,\theta}$. Thus $|\hat{S}_{p,\alpha,\theta}(pn)| \leq |S_{\alpha,\theta}(n)|$ which proves the claim.

Theorem 14. With notation as before, $$\lim_{p \to \infty} \text{cap}(\hat{S}_{p,\alpha,\theta}) = \text{cap}(S_{\alpha,\theta}).$$

Proof. Let us define $$\hat{f}_{p,\alpha,\theta}(x) = \sum_{i \geq 0} x^{-\frac{\lceil p, \alpha, \theta \rceil^i}{p}} \text{ and } f_{\alpha,\theta}(x) = \sum_{i \geq 0} x^{-\alpha \theta^i},$$

and denote by $\hat{r}_{p,\alpha,\theta}$, $r_{\alpha,\theta}$ the unique solutions in $(1, \infty)$ to $\hat{f}_{p,\alpha,\theta}(x) = 1$ and $f_{\alpha,\theta}(x) = 1$ respectively. Thus, we get $\text{cap}(\hat{S}_{p,\alpha,\theta}) = \log_2 \hat{r}_{p,\alpha,\theta}$ and $\text{cap}(S_{\alpha,\theta}) = \log_2 r_{\alpha,\theta}$.

Since $\Sigma_{i \geq 0} x^{-\lceil p\alpha, \theta \rceil^i / p}$ also passes the Weierstrass M-test conditions for any $[a,b] \subset (1, \infty)$, it follows that, $$\lim_{p \to \infty} \hat{f}_{p,\alpha,\theta}(x) = \lim_{p \to \infty} \sum_{i \geq 0} x^{-\frac{\lceil p\alpha, \theta \rceil^i}{p}}$$

$$= \sum_{i \geq 0} \lim_{p \to \infty} x^{-\frac{\lceil p\alpha, \theta \rceil^i}{p}} \sum_{i \geq 0} x^{-\alpha \theta^i}$$

$$= f_{\alpha,\theta}(x),$$

and so $\lim_{p \to \infty} \hat{r}_{p,\alpha,\theta} = r_{\alpha,\theta}$, thus completing the proof.

Figure 9:
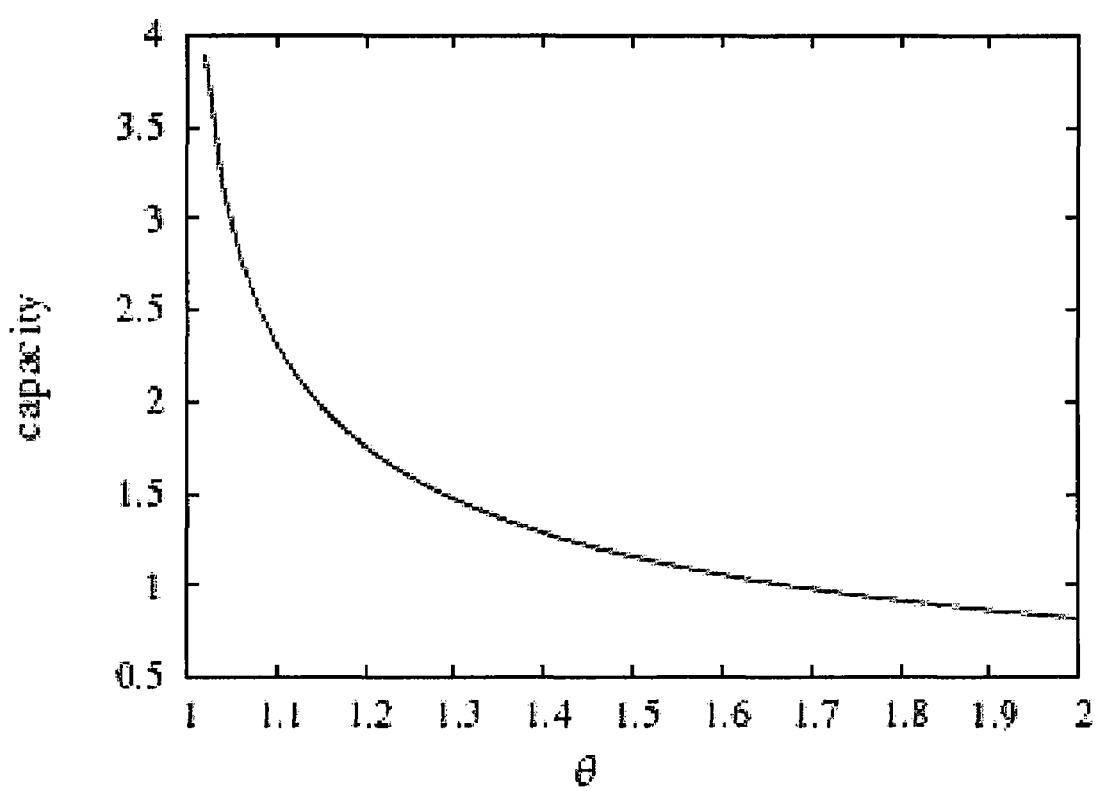
FIG. 9 is a graphical representation of the encoder parameter $\theta$ against the encoder capacity.

The capacity of the $(\infty, 1, \theta)$-PR constraint is shown in FIG. 9. Simple root-finding techniques were used together with limited precision to approximate the roots of $f_\theta(x) = 1$.

IV. Generalization and Optimality

A. Larger Alphabets

In some applications, another degree of freedom is possible in the form of a larger alphabet. In applications such as magnetic recording devices and optical storage, the recording is done using intervals of two "colors", where each two adjacent intervals have different colors and the interval is defined by the color transitions at its beginning and end. By taking the derivative of this stream of intervals we get the traditional representation as a stream of binary symbols where the 1's denote the transitions, and the amount of 0's between them count the length of the interval.

Some new applications allow intervals to be colored by more than two colors. Though we will not use this representation, again we may take the derivative and represent the encoded stream as a string of symbols over $Z_q$ where q is the number of colors. Each non-zero position represents a transition by the difference in color values in $Z_q$, while runs of 0's determine the length of the encoded interval.

The precision resolution framework for alphabets of size q, which we denote (p, α, $\theta)_q$-PR, is defined as before, only now the symbols transmitted over the channel come from the alphabet $P \times Z_q \setminus \{0\}$). The omission of 0 from $Z_q$ comes to ensure that two adjacent intervals do not have the same color, for example by defining that the element from $Z_q \setminus \{0\}$ encodes the difference in colors between the current symbol and the previous one. Though the actual number of streams should be multiplied by q to account for the choice of color for the first interval (all other colors are then determined by the difference in colors as said before), we will ignore this factor for the sake of simplicity since it does not affect the capacity calculation. Thus, from now on, by abuse of terminology, if (l, c) ∈ $R \times Z_q \setminus \{0\}$ is a transmitted symbol then we call c the color of the symbol.

Since all the theorems generalize in a similar fashion, we will prove only the generalization of Theorem 11.

Theorem 15. Let ($S_{\theta,q}$ denote the (∞, 1, $\theta)_q$-PR constrained system, $\theta > 1$, $q \geq 2$. Then $$cap(S_{\theta,q}) = \log_2 r_{\theta,q}$$

where $r_{\theta,q}$ is the unique solution in (1, ∞) to the equation $$f_\theta(x) = \frac{1}{q-1} \text{ and } f\alpha\theta(x) \stackrel{def}{=} \sum_{i \geq 0} x^{-\alpha\theta^i}.$$

Proof: We start by noting that $f_\theta(x)$ is exactly the same as in Theorem 11, and so the same arguments may be used to show that indeed there exists a unique $r_{\theta,q}$ as claimed.

Let us denote by $S_{\theta,q}(\tau)$ the set of all τ-headers of $S_{\theta,q}$. Obviously, $$|\overline{S}_{\theta,q}(\tau)| = \begin{cases} q-1 + \sum_{i=0}^{\infty}(q-1) \left| S_\theta(\tau-\theta^i) \right| & \tau > 0 \\ 1 & \tau = 0 \\ 0 & \tau < 0 \end{cases}$$

For technical simplicity let us define $\overline{S}_{\theta,q}(\tau)$ to be the set of all τ-headers of $S_{\theta,q}$ with tail strictly smaller than 1. It is easy to see that $$|\overline{S}_{\theta,q}(\tau)| = \begin{cases} \sum_{i=0}^{\infty}(q-1)|\overline{S}_\theta(\tau-\theta^i)| & \tau \geq 1 \\ q-1 & 0 < \tau < 1 \\ 1 & \tau = 0 \\ 0 & \tau < 0 \end{cases}$$

We contend that $|S_{\theta,q}(\tau)| \lfloor \tau \rfloor |\hat{S}_{\theta,q}(\tau)|$ for $\tau \geq 1$. This is because any τ-header of $\overline{S}_{\theta,q}(\tau)$ contains at most $\lfloor \tau \rfloor$ complete symbols, and since its tail is strictly shorter than 1, we can create at most $\lfloor \tau \rfloor$ distinct τ-headers in $S_{\theta,q}(\tau)$ by repeatedly merging the tail with the last complete symbol. To complete the argument, we can get any τ-header of $S_{\theta,q}(\tau)$ that way because we can take any τ-header with tail of length 1 or more, and repeatedly add complete symbols of length 1 and same color as the tail, while reducing the tail by 1, to get a τ-header from $\overline{S}_{\theta,q}(\tau)$.

We now prove by induction that $|\overline{S}_{\theta,q}(\tau)| \leq (q-1)r_{\theta,q}^\tau$. For the induction base we point out that obviously $|\overline{S}_{\theta,q}(\tau)| = 0 \leq r_{\theta,q}^\tau$ for all τ ∈ (-∞, 0) by definition. Furthermore, since $r_{\theta,q} > 1$, $|\overline{S}_{\theta,q}(\tau)| \leq q-1 \leq (q-1)r_{\theta,q}^\tau$ for all τ ∈ [0,1). For the induction hypothesis, let us assume that $|\overline{S}_{\theta,q}(\tau)| \leq (q-1)r_{\theta,q}^\tau$ for all τ ∈ (-∞, n), n ∈ N. We then prove the claim also holds for τ ∈ [n,n+1). Let τ ∈ [n,n+1), then $$|\overline{S}_{\theta,q}(\tau)| = (q-1)\sum_{i=0}^{\infty}|\overline{S}_{\theta,q}(\tau-\theta^i)| \leq (q-1)^2 \sum_{i=0}^{\infty} r_{\theta,q}^{\tau-\theta^i}$$

$$= (q-1)^2 r_{\theta,q}^\tau \sum_{i=0}^{\infty} r_{\theta,q}^{-\theta^i}$$

$$= (q-1)r_\theta^\tau$$

where we are able to use the induction hypothesis since $\theta^i \geq 1$ and so $\tau - \theta^i \in (-\infty, n)$. It follows that $$cap(S_{\theta,q}) = \lim_{\tau \to \infty} \frac{\log_2|S_{\theta,q}(\tau)|}{\tau} \leq \lim_{\tau \to \infty} \frac{\log_2 \lfloor \tau \rfloor |\overline{S}_{\theta,q}(\tau)|}{\tau} \leq \log_2 r_{\theta,q}.$$

We now want to prove that $cap(S_{\theta,q}) \geq \log_2 r_{\theta,q}$. We contend that $$|\overline{S}_{\theta,q}(\tau)| \geq \frac{1}{r_{\theta,q}} r_{\theta,q}^\tau$$

for all $\tau \geq 0$. We do this again by induction. For the induction base take any τ ∈ [0,1) and then $$|S_{\theta,q}(\tau)| \geq 1 \geq \frac{1}{r_{\theta,q}} r_{\theta,q}^\tau.$$

For the induction hypothesis we assume that $$\left| S_{\theta,q}(\tau) \right| \geq \frac{1}{r_{\theta,q}} r_{\theta,q}^\tau$$

for all τ ∈ [0,n), n ∈ N. We prove the claim also holds for τ ∈ [n,n+1). Taking τ ∈ [n,n+1) it follows that, $$|S_\theta(\tau)| = q-1 + (q-1)\sum_{i=0}^{\infty}|S_{\theta,q}(\tau-\theta^i)|$$

-continued $$= (q-1)\left(1 + \sum_{i=0}^{\lfloor\log_\theta \tau\rfloor} |S_{\theta,q}(\tau - \theta^i)|\right)$$

$$\geq (q-1)\left(1 + \sum_{i=0}^{\lfloor\log_\theta \tau\rfloor} \frac{1}{r_{\theta,q}} r_{\theta,q}^{\tau-\theta^i}\right)$$

$$= (q-1)\left(1 + \sum_{i=0}^{\infty} \frac{1}{r_{\theta,q}} r_{\theta,q}^{\tau-\theta^i} - \sum_{i=\lfloor\log_\theta \tau\rfloor+1}^{\infty} \frac{1}{r_{\theta,q}} r_{\theta,q}^{\tau-\theta^i}\right)$$

$$= (q-1)\left(1 + \frac{r_{\theta,q}^\tau}{(q-1)r_{\theta,q}} - \sum_{i=\lfloor\log_\theta \tau\rfloor+1}^{\infty} \frac{1}{r_{\theta,q}} r_{\theta,q}^{\tau-\theta^i}\right)$$

$$\geq (q-1)\left(1 + \frac{r_{\theta,q}^\tau}{(q-1)r_{\theta,q}} - \sum_{i=0}^{\infty} \frac{1}{r_{\theta,q}} r_{\theta,q}^{-\theta^i}\right)$$

$$= \frac{1}{r_{\theta,q}} r_{\theta,q}^\tau + q - 2 \geq \frac{1}{r_{\theta,q}} r_{\theta,q}^\tau.$$

Thus we get $$\operatorname{cap}(S_{\theta,q}) = \lim_{\tau\to\infty} \frac{\log_2|S_{\theta,q}(\tau)|}{\tau} \geq \log_2 r_{\theta,q}$$

which completes the proof.

Figure 10:
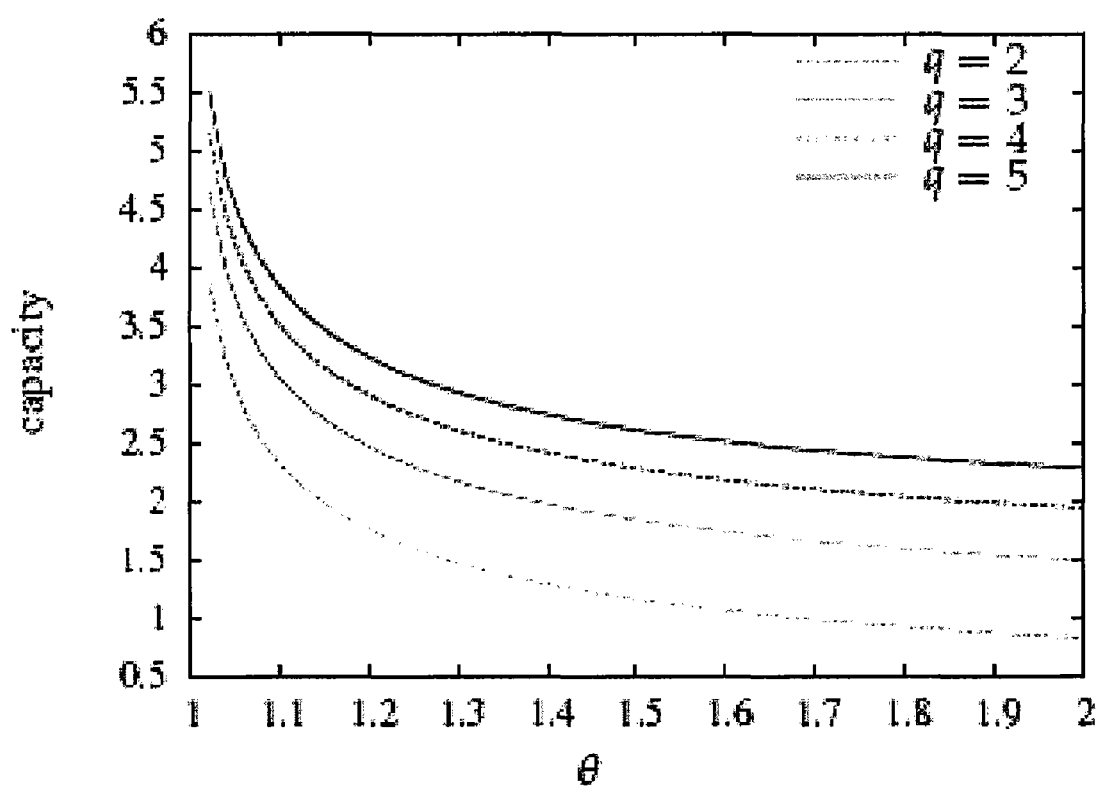
FIG. 10 is a graphical representation of the encoder parameter $\theta$ against the encoder capacity for various q-values.

The capacity of the $(\infty, 1, \theta)_q$-PR constraint for $q=2, 3, 4, 5$ is shown in FIG. 10. Simple root-finding techniques were used together with limited precision to approximate the roots off $$f_\theta(x) = \frac{1}{q-1}.$$

B. General Receiver Errors and Optimality

Up until now we have considered just one type of error at the receiver, a multiplicative error caused by clock drift. Those skilled in the art will understand that clock drift error is a multiplicative error, described by resolution restriction functions L(t) and R(t) that were expressed as a simplified quotient θ. However, in many cases the situation is more complex and other types of errors may be involved and even combined together, such as additive jitter error combined with multiplicative clock-drift error. That is, the alphabets for representation of encoded input binary symbols have been specified above in connection with only clock drift error, and the resulting resolution factor θ is but one expression of the resolution restriction functions L(t) and R(t) for the data channel. The alphabet for other types of errors, or combinations of errors, would likely involve different sets of values.

In a more general setting, we associate two resolution-restriction functions, L(t) and R(t), with the receiver, where L, R:R→R. When a symbol t ∈ R is transmitted, the receiver may read any of the values in the interval! (L(t), R(t)). For example, those skilled in the art will understand that a multiplicative clock-drift error is defined by L(t)=(1−δ)t and R(t)=(1+δ)t, and an additive jitter error is defined by L(t)=t−Δ and R(t)=t+Δ, while their combination may be defined by L(t)=min {(1−δ)t, t−Δ} and R(t)=max {(1+δ)t, t+Δ}.

Underlying the previous sections is a process for producing an alphabet, or set of symbols, for representation of the input binary symbols. As inputs for the alphabet process, it is necessary to specify a precision p, minimum resolution a, and resolution-restriction functions L(t) and R(t). The process then chooses a symbol set greedily. More precisely, we start with an empty symbol set. Each time we add the minimal symbol t ∈ R such that it is correctly aligned according to p, is above the minimal resolution α, and (L(t), R(t)) has an empty intersection with (L(t), R(t)) for any t' of the previously selected symbols. We call this alphabet-producing process the precision-resolution symbol-selection algorithm. That is, if error in the data channel can be specified in terms of functions L(t) and R(t), then the precision resolution symbol selection algorithm above specifies a process for producing the alphabet for encoded representation of the input binary symbols.

Theorem 16. Given precision p, minimum resolution α, and resolution-restriction function L(t) and R(t), let I be the symbol set selected by the precision-resolution symbol-selection algorithm, and let I' be some other symbol set which respects p, α, L(t), and R(t). Let S and S' be the resulting constrained systems from I and I' respectively. If R(t) is monotone non-decreasing, then cap(S)≧cap(S').

Proof: We denote I={$t_1, t_2, \ldots$} and t'={$t'_1, t'_2, \ldots$}, where we sort the symbols in increasing order, that is, if i<j then $t_i<t_j$ and $t'_i<t'_j$. Let n be the first index for which $t_n\neq t'_n$, i.e., $t_i=t'_i$, for all $1\leq i\leq$, n−1. By the definition of the precision-resolution symbol-selection algorithm, necessarily $t_n<t'_n$.

Let us now define I″=I \ {$t'_n$}∪ {$t_n$}, that is, we take I' and replace $t'_n$ with $t_n$. We contend that I″ also respects p, α, L(t), and R(t). Since $t_n$™ I, then we certainly have no problem with the precision p and the minimum resolution α. Also, $(L(t_n), R(t_n))$ has empty intersection with $(L(t_i), R(t_i))$ for all $1\leq i\leq n-1$. So our only concern is that $(L(t_n), R(t_n))$ intersects $(L(t'_{n+1}), R(t'_{n+1}))$. But since $t_n\leq t'_n$ we have $R(t_n)\leq R(t'_n)\leq L(t'_{n+1})$ where the first inequality holds because R(t) is monotone non-decreasing, and the second holds because I″ respects L(t) and R(t).

Repeating this process we arrive at the conclusion that $t_i\leq t'_i$ for all i≧n. Thus, whenever we inspect the set of τ-headers, |S(τ)|≧|S'(τ)| and so cap(S)≧cap(S').

The precision-resolution system described in the previous sections may lead the unwary reader to assume the receiver requires readings which are at least as precise as the precision at the encoder, or conversely, that there is nothing to be gained by having an encoder more precise than the precision of the readings at the receiver side. At this point we can demonstrate this is not true with the following simple example.

Example 17. Suppose the receiver has minimal resolution α=1, it suffers from a multiplicative error in its measurements, and al its readings are rounded up to the nearest integer. That is, a transmitted interval t may be read as any integer in [⌈(1+δ)⌉t, ⌈(1+δ)t⌉]. This would correspond to resolution-restriction functions L(t)=⌈(1+δ)t⌉−0.5, and R(t)=⌈(1+δ)t⌉+0.5, with δ=0.1. The ±0.5 is introduced just to be consistent with the fact that the readings are in the open interval (L(t), R(t)).

An encoder with precision p=1, the same precision as the readings on the receiver side, has a symbol set {1, 3, 5, ...}. An encoder with a higher precision of p=10 has a symbol set {1, 2.3, 3.4, ...} which obviously results in a higher capacity.

V. Results Summary

We started by exploring the (1, α, θ)-PR constraint which is a natural extension to (d, k)-RLL. The extension allows more run-lengths to be written than (d, k)-RLL admits, subject to the restriction that the decoder, which suffers from a bounded clock drift, can get no ambiguous reading. In light of this, the RLL restriction to successive run-lengths seems arbitrary.

We further generalized our setting by defining the (p, α, θ)-PR framework, and the (p, α, θ)-PR constraint which realizes the framework. We then showed that as p→∞, the capacity of (p, α, θ)-PR approaches that of (∞, α, θ)-PR from below. We also generalized from the (∞, α, θ)-PR coding constraint by describing the more general representation of the PR coding scheme given by the general case of the resolution restriction functions L(t) and R(t), in conjunction with the desired data channel capacity and the p, α parameters. We also noted that the alphabet size (number of allowable symbols) can be limited according to practical considerations and the law of diminishing returns for adding to the alphabet.

We concluded by showing the underlying greedy algorithm used to choose the symbols given the parameters of the system. This algorithm may be used in a wide range of parameters which under a weak assumption, ensures that the precision-resolution constrained system achieves the optimal capacity. Since the RLL constraint is mainly used today in conjunction with PRML, it is tempting to merge the PR constraint with PRML. Future work may consider the interplay between the two by considering PRML parameters, e.g., sampling rate, as a set of resolution constraints, perhaps achieving another increase in capacity in some applications.

Though the RLL constraint also fits the framework's requirements, the PR coding constraint seems more natural, and it achieves a higher capacity which does not vanish for p>1 as in the case of RLL. This is especially appealing for engineering reasons: having only an RLL solution, any improvement in precision, e.g., faster clocks, require lower clock-drift or else the capacity may drop to zero. However, in the PR coding scheme, the two parameters of precision and resolution factor are independent. Thus, they allow improvement of one without the other, and offer a trade-off if our goal is to reach a certain capacity.

Thus, if a PR coding scheme is specified for use in connection with a data channel (such as CD or DVD data storage), and if improvements in encoding technology are achieved, without corresponding improvements in decoding technology (or vice versa), then it is possible to specify a new PR coding constraint for the data channel that can exploit the technology improvement. Such exploitation of improvements in one side of the data channel are not possible with conventional RLL coding schemes.

VI. Applications and Embodiments

A. Encoding and Decoding System

Figure 11:
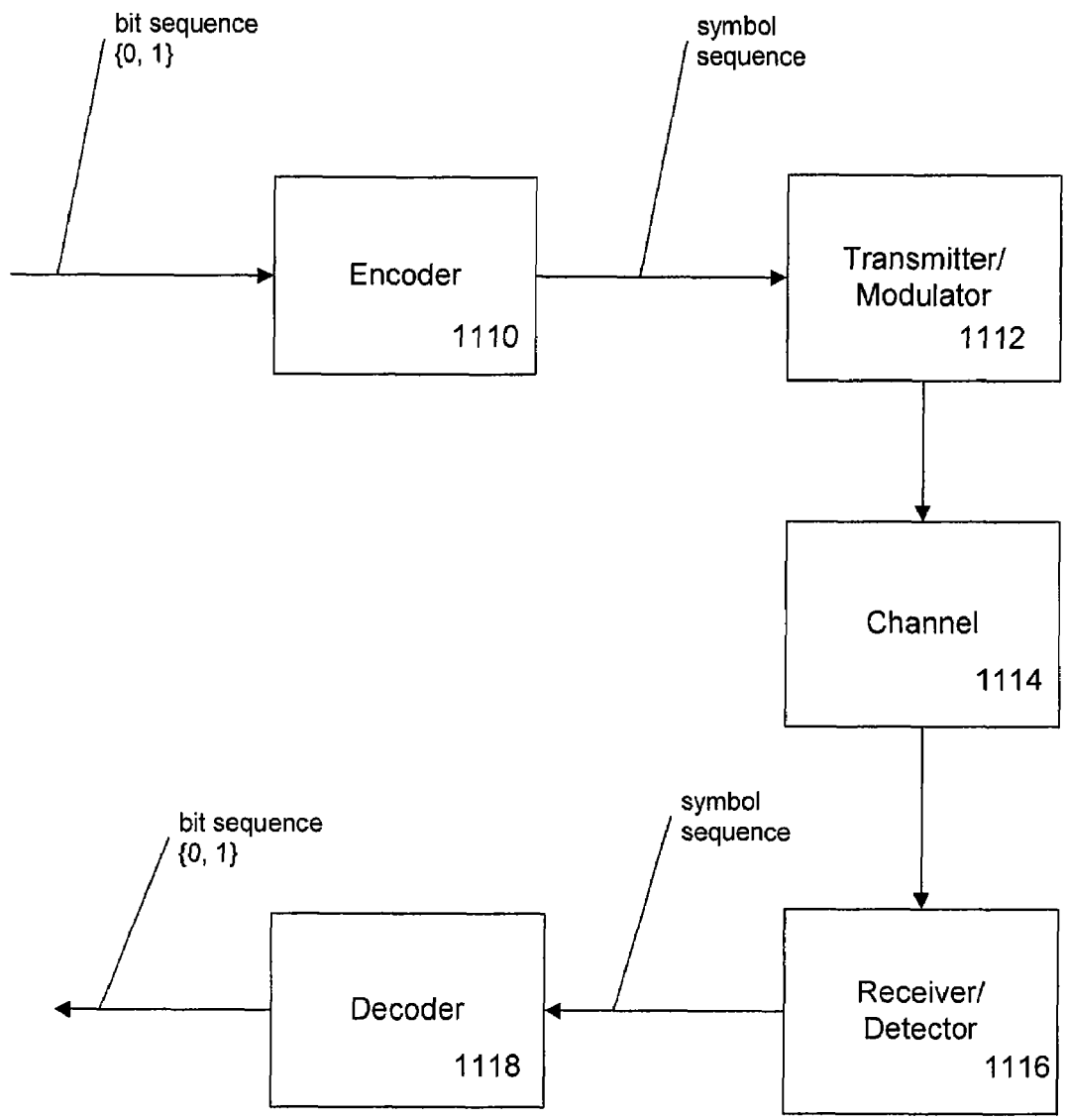
FIG. 11 is a schematic block diagram of a system that performs encoding and decoding pursuant to a coding scheme in accordance with the present invention.

FIG. 11 is a schematic block diagram of a system that performs an encoding and decoding for a data channel in accordance with the present invention. The system receives a sequence of input binary symbols comprising bits {0, 1} into an encoder 1110 that transforms the input (unconstrained) sequence into a sequence that is constrained according to an alphabet specified by the PR constraint coding scheme such as described above. For example, as noted above in connection with FIG. 7(a)-(d), the conventional (1, 2)-RLL coding scheme has an alphabet comprising {2, 3}, meaning that any two consecutive input "1" bits will result in a waveform in which two peaks are separated by either two or three clock intervals. In contrast, per the example of FIG. 7(c) and accompanying text above, the (2, 2, 1.5)-PR coding scheme provides an alphabet with the first four alphabet symbols comprising {2, 3, 4.5, 8} and per the example of FIG. 7(d) and accompanying text above, the (∞, 2, 1.5)-PR coding scheme provides an alphabet with the first four symbols comprising {2, 3, 4.5, 6.75}. Thus, FIG. 11 shows that an input sequence of binary symbols will be encoded into a representation using a PR-constraint alphabet specified in accordance with the present invention. Many suitable encoding implementations will occur to those skilled in the art. For example, the encoder 1110 can perform the transformation by utilizing a look-up table that implements the coding rules for a given data channel specification. Thus, the output of the encoder 1110 is a representation in accordance with the PR-constrained alphabet. As noted above, the size of the alphabet can be arbitrarily set to a limit and specified by a translation scheme in consideration of available system resources and diminishing returns. One example of a translation scheme given the coding alphabet specified by the present invention is given by the ETR040 report cited above.

The representation from the encoder 1110 is received by a transmitter/modulator 1112 that prepares the representation for transmission over the data channel 1114. The transmitter/modulator will receive the encoder output and will recognize the corresponding output waveform that should be produced. For example, the encoder can be equipped with circuitry that produces output over data lines that will be coupled to the transmitter/modulator so as to be recognized by the transmitter/modulator as indicating appropriate alphabet symbols such as {2, 3, 4.5, 8} in the case of the first four symbols of a (2, 2, 1.5) PR code.

The transmitter/modulator 1112 will produce the output waveform in a suitable configuration for the data channel 1114. For example, if the data channel comprises an optical media such as an optical fiber cable or an optical storage disc, then the modulator 1112 will comprise a circuit and a laser module that produces laser pulses of light in accordance with the input symbols. If the data channel 1114 comprises an electromagnetic transport, such as radio frequency (RF) signals, then the modulator 1112 will comprise an RF transmitter device. The output of the modulator is transmitted over the data channel 1114 in a suitable manner. For example, the data channel can comprise an optical fiber cable, or can comprise an optical storage media such as a CD data disc, or can comprise a conductive cable that carries electrical signals, or can comprise air through which RF telecommunications signals can travel.

After the encoder representation is received at the modulator 1112 and is modulated into a suitable waveform and is transmitted over the data channel 1114, the waveform is received at a receiver/detector 1116. For example, in the case of an optical data channel, the receiver 1116 might comprise a photodiode and associated circuitry to convert received light (laser) pulses into electrical signals comprising a received waveform. If the data channel involves RF transmission, then the receiver 1116 comprises an RF receiver that can receive the telecommunication waves of the RF transmission and can convert the transmission to a suitable electrical signal. The receiver/detector measures the time interval between peaks of the received waveform and quantizes the time intervals according to the allowable time intervals according to the PR-constrained alphabet for the data channel, corresponding to the alphabet that was used by the encoder 1110. The output of the receiver 1116 is a representation that corresponds to the output of the encoder 1110.

The output representation from the receiver 1116 is provided to a decoder 1118 that transforms the received representation into a decoded (unconstrained) bit sequence that is decoded according to the inverse specification that was utilized by the encoder 1110 to produce or recover the original input binary symbols that were provided to the encoder 1110. The decoder 1118 can perform the transformation, for example, by utilizing a look-up table that implements the coding rules for the data channel specification. In this way, the decoder 1110 receives a representation that follows coding rules of the data channel specification and produces an output comprising a {0, 1} bit sequence that corresponds to the original input bit sequence.

Details of the FIG. 11 components can vary. For example, the look-up table processing can be implemented as a finite state machine. The necessary logical processing operations of the machine can be implemented in software using if-then rules or program statements or in circuitry using suitable logic gates. The components illustrated in FIG. 11 can be implemented in a single integrated device, such as illustrated in FIG. 12 below that can encode and decode, or the components can be separate components that nevertheless work cooperatively together to perform in accordance with the invention as described above.

B. Data Device

Figure 12:
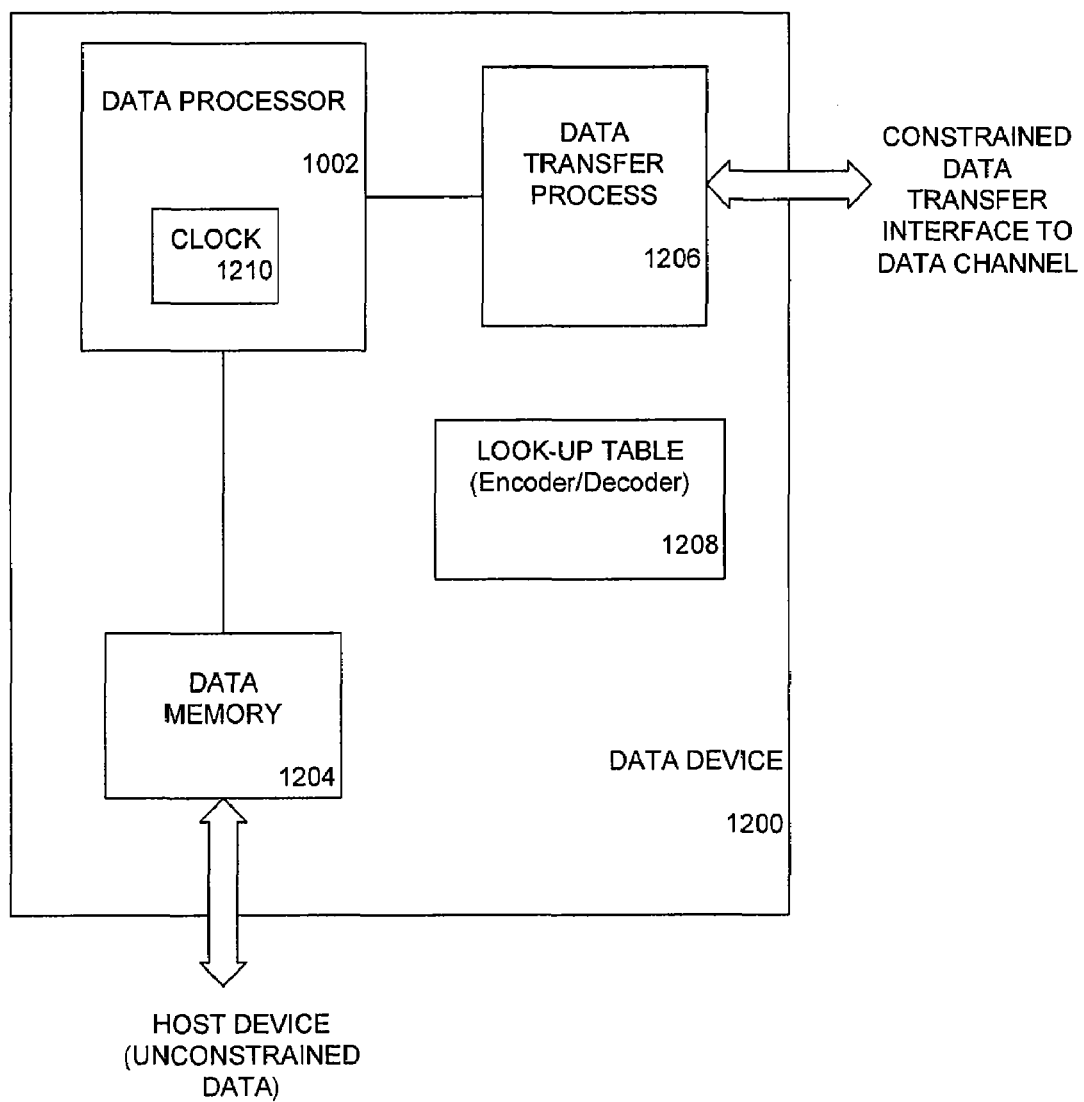
FIG. 12 is a schematic block diagram of a device that implements the coding scheme in accordance with the present invention.

FIG. 12 shows a data device 1200 that processes data in accordance with the present invention and provides an integrated device that can both encode and decode bit sequences in accordance with the invention. The data device 1200 can be integrated into, for example, a disk drive where the data channel is a disk media, or the data device can be integrated into a radio frequency telecommunications device, where the data channel comprises an RF signal. The data system from which the data device 1200 obtains data for encoding (or to which the data device provides decoded data) is referred to as a host device. The host device can comprise associated circuitry of, for example, the associated disk drive or RF transceiver. Data transfer to the data channel takes place using suitable equipment of the host device. For example, a data device 1200 for use with a disk media data channel would operate in conjunction with a disk drive interface, and a data device for use with a telecommunications system would operate in conjunction with RF transmitter and receiver circuitry of the system.

A data control processor 1202 of the data device 1200 interfaces to unconstrained data to and from a data memory 1204, and interfaces to constrained data to and from a data transfer process 1206. During data encoding, the data device 1200 receives unconstrained data, such as data words or graphics image data or the like, from a host device and temporarily stores the unconstrained data into the data memory 1204 of the device. The processor 1202 formats the unconstrained data and passes it to the data transfer process 1206, which transfers it to a data channel so that constrained data is produced from the data device 1200, for data storage or data transmission over the data channel. Thus, the output from the data transfer process 1206 is a data stream in which the sequence of bits is in accordance with the minimum resolution parameter $\alpha$, a resolution factor $\theta$, and a precision parameter p of the present invention.

Transmission over the data channel can comprise, for example, storage onto a magnetic disk or an optical storage disc, or can comprise transfer to telecommunications system circuitry for transmission over a telecommunications channel. In accordance with the invention, the data will be encoded using the minimum resolution parameter $\alpha$, a resolution factor $\theta$, and a precision parameter p of the present invention to produce the constrained code. The coding scheme that specifies the mapping of data symbols onto input sequences of data bits can be contained in a look-up table 1208 or can be contained in the data memory of the data device. In either case, the data processor 1202 will consult the coding scheme to determine the appropriate processing (data encoding) that should occur.

During decoding of constrained data, the data device 1200 receives constrained data from a data channel, such as magnetic disk or optical storage disc or a telecommunications connection, into the data transfer process 1206. The constrained data is provided to the data control processor 1202, which decodes the data in accordance with the present invention and passes the unconstrained data to the data device memory 1204 for transfer to a host device or other processing units or accessories. Thus, the output of the output of the data transfer process 1206 is a stream of constrained data comprising data pulses separated in accordance with the minimum resolution parameter $\alpha$, a resolution factor $\theta$, and a precision parameter p of the present invention, and the output of the control processor 1202 is a stream of recovered data. The device can store a mapping of symbols onto the encoded data, comprising a decoding scheme, in a look up table 1008 or the decoding scheme can be stored in the data memory for use by the data processor.

The data device 1200 transfers data to and from the data channel(s) in accordance with a device clock, illustrated as a clock circuit 1210. The clock circuit can be implemented as an analog clock circuit that produces clock intervals as specified by the symbol set S, or the clock circuit can be implemented as a digital clock that produces clock intervals that are integer multiples of a base clock interval.

Those skilled in the art will understand that the look-up table 1208 comprises stored processing rules that, when executed, will implement the mapping from unconstrained data to constrained data and will implement the mapping from constrained data back to unconstrained data. It should be apparent that the look-up table or some similar structure that operates in a similar fashion will be provided in the encoder 1110 and decoder 1118 illustrated in FIG. 11. Accordingly, the encoder 1110 and decoder 1118 will include data storage containing the look-up table processing rules and a processor that can implement the look-up table processing rules to perform the encoding and decoding in accordance with the present invention. The look-up table and data processor can be implemented, for example, in an integrated circuit chip or as a processor and firmware combination.

A sequence of input binary symbols (such as a bit stream) can be encoded, transmitted over a data channel, received and decoded, and the original input binary symbols can be recovered, in a variety of devices. Such devices will all perform encoding and decoding operations, though it should be understood that not all devices will perform both sets of operations, in that some devices may comprise encoders only, or decoders only, rather than both.

Figure 13:
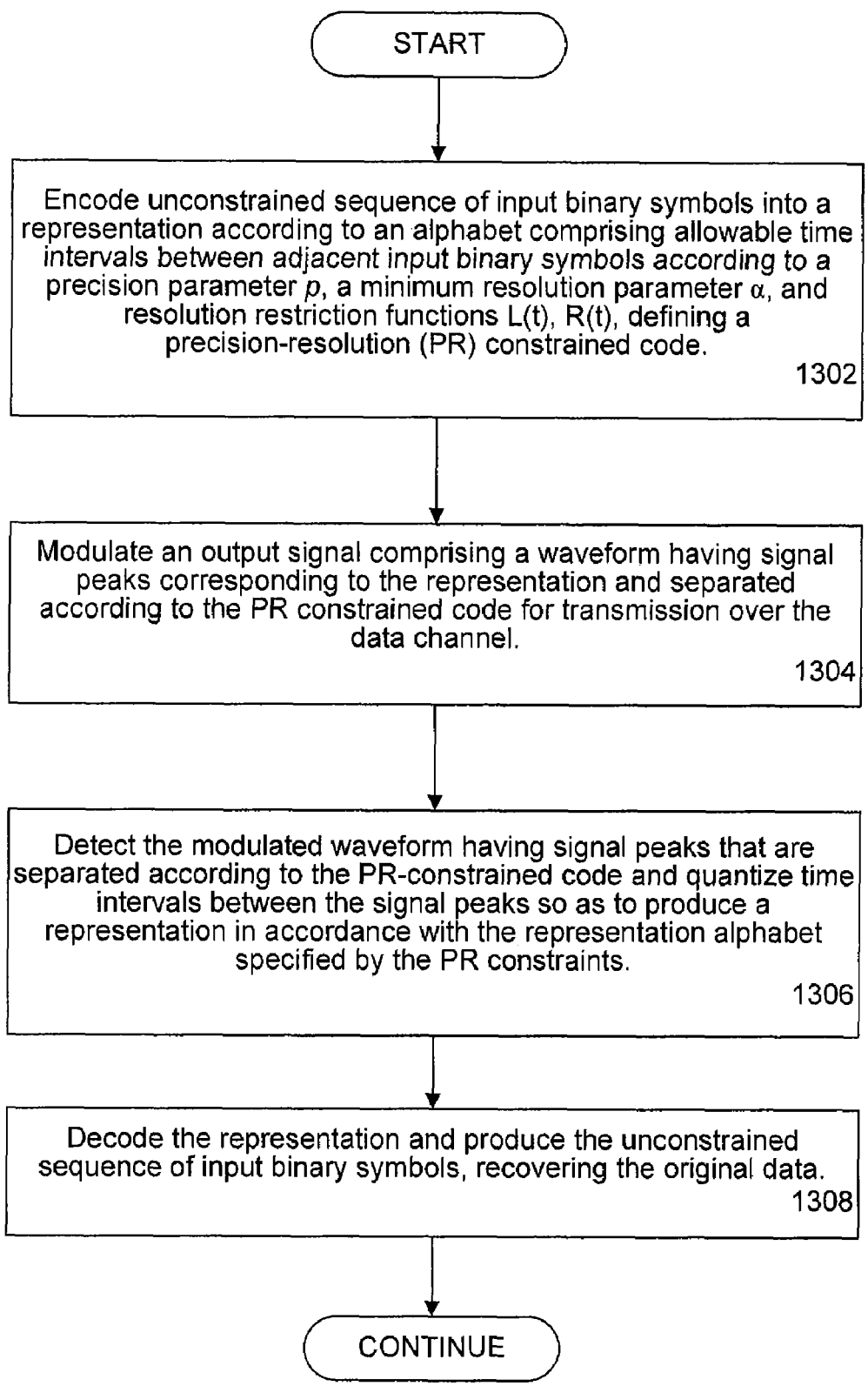
FIG. 13 is a flowchart that illustrates operations performed in encoding and decoding input binary symbols in accordance with the present invention.

FIG. 13 shows a process for encoding and decoding a sequence of binary symbols in a device. In the first operation, illustrated as box 1302 in FIG. 13, the device encodes data comprising an unconstrained sequence of input binary symbols into a representation according to an alphabet comprising allowable time intervals between adjacent input binary symbols according to a precision parameter p, a minimum resolution parameter $\alpha$, and resolution restriction functions L(t), R(t), thereby defining a precision-resolution (PR) constrained code. As noted above, the alphabet may be specified according to precision and resolution parameters, and also according to one or more error functions. In the next operation, box 1304, the device modulates an output signal comprising a waveform having signal peaks corresponding to the representation and separated according to the PR-constrained code for transmission of the output signal over the data channel. Transmission of the output signal over the data channel can comprise, for example, writing data to a magnetic disk, or sending the data over an RF transmission, or writing data to an optical data disc, or the like. After transmission over the data channel, the waveform can be received and then, at box 1306, the device can detect the modulated waveform having signal peaks that are separated according to the PR-constrained code and quantizes time intervals between the signal peaks so as to produce a representation in accordance with the representation alphabet. Next, at box 1308, the device can decode the representation and produce the unconstrained sequence of input binary symbols, thereby recovering the original data.

The Precision Resolution (PR) coding scheme described herein can be used to specify coding schemes for modulation of data over a data channel, with which encoding and decoding of data will take place. Just as the (d, k)-RLL scheme has been used to specify data channel transmission over systems such as magnetic hard disk drives and CD optical media and the like, the PR coding scheme of the present invention can be used to specify data channel transmission. A methodology or process can be followed for determining a PR coding scheme in accordance with data channel capacity and system requirements.

Figure 14:
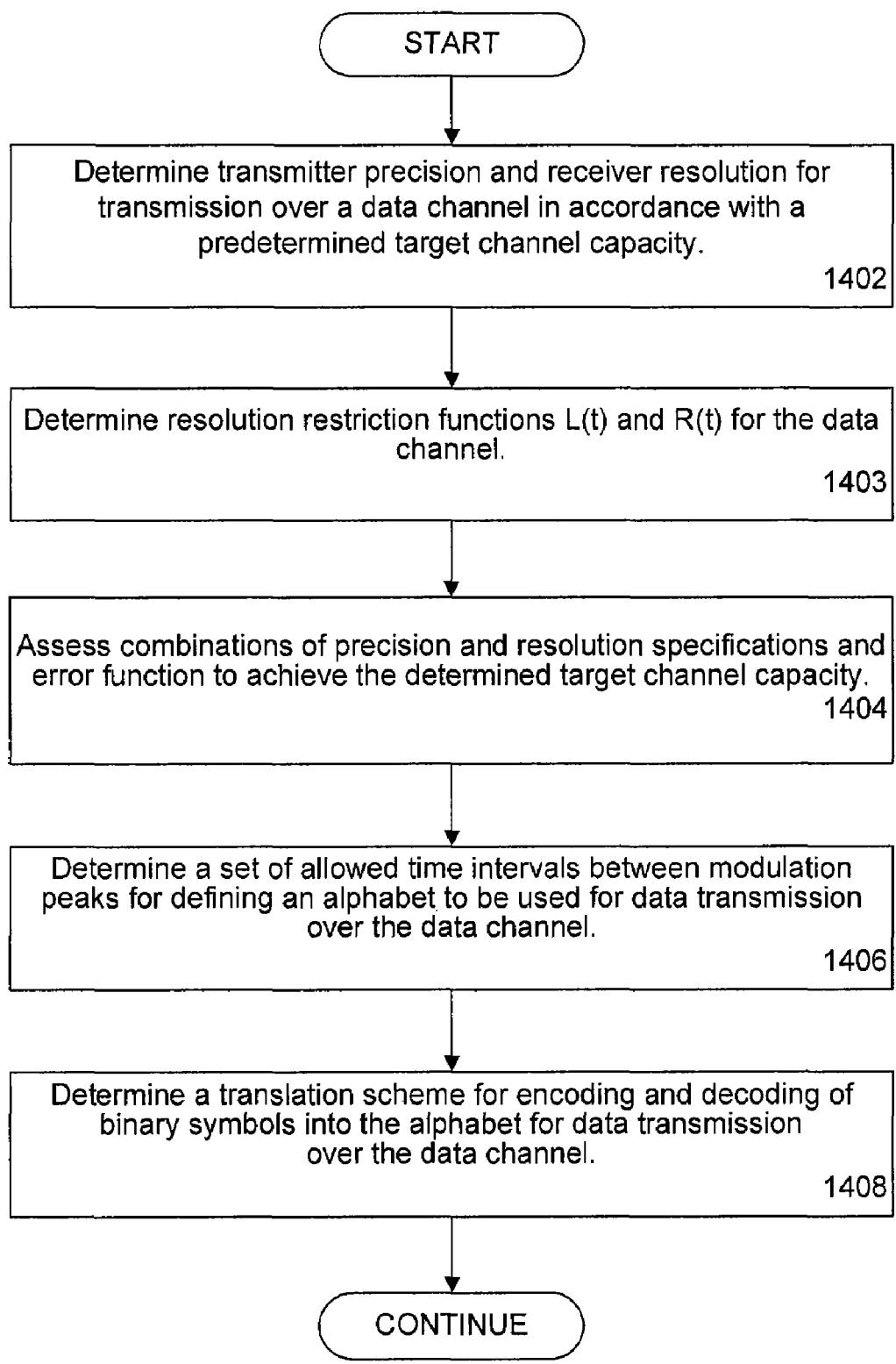
FIG. 14 is a flowchart that illustrates operations performed in producing an alphabet suitable for encoding and decoding input binary symbols in accordance with the present invention.

FIG. 14 shows a process for determining specifications of a PR coding scheme for a data channel. The process can be implemented as an application program for execution on a general purpose computer. In the first operation, illustrated as box 1402 in FIG. 14, after a target capacity for the channel has been set as a design goal for a data channel, the data transmitter (encoder) precision and the data receiver (decoder) resolution are determined. In the next operation, box 1404, combinations of transmitter precision and receiver resolution are examined and cost/benefit analysis of the combinations is performed. That is, at box 1404, a collection of precision and resolution parameter combinations given a desired channel capacity are produced and a modulation vocabulary is thereby specified in accordance with a selected set of PR coding parameters (that is, specification of a PR coding scheme as described above) given the parameter combinations and desired channel capacity. In the next operation, at box 1406, the collection of parameter combinations is reviewed and, given the precision and resolution combinations and the trade-offs between the two, a PR specification is determined to be optimal and is selected for the data channel in question.

At box 1406, the selection can be determined in accordance with developer design priorities. For example, if greater precision can be achieved at relatively low cost, but getting increased resolution is relatively costly, then a developer might raise the desired precision and lower the desired resolution to keep the desired channel capacity and reduce the overall cost of the product that will encode and decode over the data channel. Those skilled in the art will be familiar with techniques to provide an application and user interface that permits a developer to input precision and resolution parameters, and data channel capacity requirements, to enable a developer to generate combinations of parameters and produce a set of PR coding parameters and assess the combinations to make a selection.

Once the parameters for the desired PR coding scheme are selected, the optimal vocabulary in accordance with the invention can be selected. This operation is illustrated by box 1408 of FIG. 14. In particular, the output of the processing will specify a set of allowed intervals between peaks in the modulation. Once the selected PR coding scheme is specified, a translation scheme can be selected for actual encoding and decoding of data. The translation scheme will translate an arbitrary stream of unconstrained input bits into a stream of symbols or numbers from the vocabulary (encoding), and back from symbols or numbers to bits (decoding).

The PR-constrained coding scheme can be determined in accordance with software application tools that can be used on a variety of hardware platforms. A conventional desktop computer system can be used to investigate the various specification parameters described above to construct suitable PR-constrained coding schemes and determine suitable alphabets for use with such coding schemes. Those skilled in the art will also be able to construct suitable software application tools that can receive the specifications needed to generate potential PR-constrained coding schemes and produce and investigate corresponding code alphabets. An example of a suitable conventional computer for such purposes is illustrated in FIG. 15 and is described below.

Figure 15:
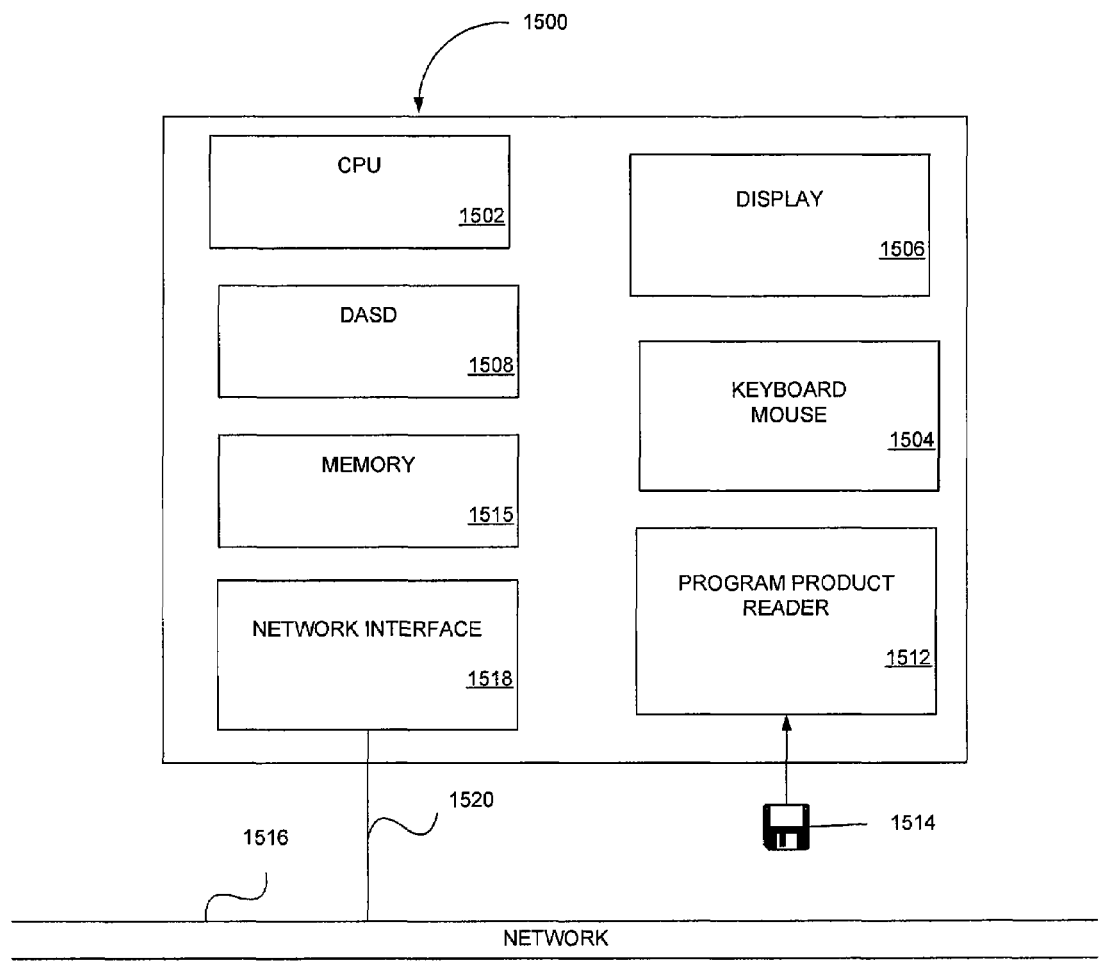
FIG. 15 is a schematic block diagram of a computing device that can be used to determine a coding scheme in accordance with the present invention.

FIG. 15 shows an exemplary computer 1500 such as might comprise a computer system for executing the PR-constrained code development tool described above. The computer 1500 can be a stand-alone computer or can be operated in a networked environment that permits communication with other computers. The computer 1500 operates under control of a central processor unit (CPU) 1502, such as a "Core Duo" microprocessor and associated integrated circuit chips, available from Intel Corporation of Santa Clara, Calif., USA. A computer user can input commands and data from a keyboard and computer mouse 1504, and can view inputs and computer output at a display 1506. The display is typically a video monitor or flat panel display. The computer 1500 also includes a direct access storage device (DASD) 1508, such as a hard disk drive. The memory 1515 typically comprises volatile semiconductor random access memory (RAM). Each computer preferably includes a program product reader 1512 that accepts a program product storage device 1514, from which the program product reader can read data (and to which it can optionally write data). The program product reader can comprise, for example, a disk drive, and the program product storage device can comprise removable storage media such as a magnetic floppy disk, a CD disc, or DVD disc. Other alternative reader/storage device combinations include external storage media such as flash drives and the like.

The computer 1500 can communicate with any other computers, if networked, over a computer network 1520 (such as the Internet or an intranet) through a network interface 1518 that enables communication over a connection 1522 between the network 1520 and the computer. The network interface 1518 typically comprises, for example, a Network Interface Card (NIC) or a modem that permits communications over a variety of networks.

The CPU 1502 operates under control of programming steps that are temporarily stored in the memory 1515 of the computer 1500. When the programming steps are executed, the computer performs its functions. Thus, the programming steps implement the functionality of the development tool application. The programming steps can be received from the DASD 1508, through the program product storage device 1514, or through the network connection 1522. The program product storage drive 1512 can receive a program product 1514, read programming steps recorded thereon, and transfer the programming steps into the memory 1515 for execution by the CPU 1502. As noted above, the program product storage device can comprise any one of multiple removable media having recorded computer-readable instructions, including magnetic floppy disks and CD and DVD data storage discs. Other suitable program product storage devices can include magnetic tape and semiconductor memory chips and flash memory drives. In this way, the processing steps necessary for operation in accordance with the invention can be embodied on a program product.

Alternatively, the program steps can be received into the operating memory 1515 over the network 1520. In the network method, the computer receives data including program steps into the memory 1515 through the network interface 1518 after network communication has been established over the network connection 1522 by well-known methods that will be understood by those skilled in the art without further explanation. The program steps are then executed by the CPU 1502 thereby comprising a computer process.

Thus, described above is a new coding scheme for transfer of data across a data channel, in which the new coding scheme is specified in terms of a precision-resolution (PR) paradigm. The new PR coding scheme is not subject to the arbitrary limitation on the code alphabet of available time intervals between waveform peaks, such as encountered with conventional (d, k)-RLL coding schemes. Also described above is a technique for determining a suitable PR-coding scheme and corresponding alphabet, given a set of parameters comprising a precision constraint, resolution constraint, and error function, along with a desired data capacity for the data channel with which the coding scheme will be used. The resulting alphabet specifies the representation that will result from encoding of an unconstrained sequence of input binary symbols. The resulting representation can be transformed into a waveform that is modulated in accordance with the alphabet to provide an output signal to the data channel such that time intervals between waveform peaks will efficiently utilize the data channel and provide the desired capacity with successful transmission of data over the data channel.

The present invention has been described above in terms of presently preferred embodiments so that an understanding of the present invention can be conveyed. There are, however, many configurations and techniques for data coding schemes not specifically described herein, but with which the present invention is applicable. The present invention should therefore not be seen as limited to the particular embodiments described herein, but rather, it should be understood that the present invention has wide applicability with respect to data coding schemes generally. All modifications, variations, or equivalent arrangements and implementations that are within the scope of the attached claims should therefore be considered within the scope of the invention.

We claim:

1. A method of processing data for transmission over a data channel, the method comprising:
   encoding data comprising an unconstrained sequence of input binary symbols into a representation according to an alphabet comprising allowable time intervals between adjacent input binary symbols according to a precision parameter p, a minimum resolution parameter $\alpha$, and resolution restriction functions L(t) and R(t), thereby defining a precision-resolution (PR) constrained code;
   modulating an output signal comprising a waveform having signal peaks corresponding to the representation and separated according to the PR-constrained code for transmission of the output signal over the data channel.

2. The method in claim 1, wherein the resolution restriction functions are specified by a multiplicative error function given by a resolution factor $\theta$ that is specified in accordance with a clock drift parameter $\delta$ where $0<\delta<1$, and $\theta$ is defined by $\theta=(1+\delta)/(1-\delta)$ and indicates a minimum disjoint neighborhood between adjacent symbols for the data channel.

3. The method in claim 1, wherein the resolution restriction functions are specified in accordance with an additive error parameter $\Delta$.

4. The method in claim 1, wherein the precision parameter p is defined by p>1.

5. The method in claim 1, wherein the output signal waveform is produced in accordance with an increased precision value p' that is greater than the precision parameter p specified for the data channel.

6. The method in claim 1, wherein the precision parameter p is defined by an increased precision value approaching a theoretical limit of p=∞.

7. The method in claim 1, wherein the representation of the input binary symbols is produced in accordance with an enlarged alphabet having an additional degree of freedom in attributes as compared with the representation alphabet.

8. The method in claim 7, wherein the additional degree of freedom comprises color.

9. The method in claim 1, further comprising:
   detecting a modulated waveform having signal peaks that are separated according to the PR-constrained code and quantizing time intervals between the signal peaks so as to produce a representation in accordance with the representation alphabet; and
   decoding the representation and producing the unconstrained sequence of input binary symbols.

10. The method in claim 9, wherein modulating the output signal is performed by a modulator that transmits the modulated waveform over the data channel, and a detector receives the modulated waveform and performs the detecting.

11. The method in claim 1, wherein the representation alphabet includes attributes comprising color.

12. The method in claim 1, wherein the representation alphabet includes non-consecutive integers.

13. The method in claim 1, wherein the representation alphabet includes non-integer numbers.

14. A method of processing data received over a data channel, the method comprising:
   detecting time intervals between signal peaks of a modulated waveform and quantizing the time intervals so as to produce a quantized representation in accordance with an alphabet comprising allowable time intervals between adjacent input binary symbols according to a precision parameter p, a minimum resolution parameter $\alpha$, and resolution restriction functions L(t) and R(t), thereby defining a precision-resolution (PR) constrained code;
   decoding the quantized representation so as to produce a decoded sequence of unconstrained output binary symbols.

15. The method in claim 14, wherein the resolution restriction functions are specified by a multiplicative error function given by a resolution factor $\theta$ that is specified in accordance with a clock drift parameter $\delta$ where $0<\delta<1$, and $\theta$ is defined by $\theta=(1+\delta)/(1-\delta)$ and indicates a minimum disjoint neighborhood between adjacent symbols for the data channel.

16. The method in claim 14, the resolution restriction functions are specified in accordance with an additive error parameter $\Delta$.

17. The method in claim 14, wherein the precision parameter p is defined by p>1.

18. The method in claim 14, wherein the output signal waveform is modulated in accordance with an increased precision value p' that is greater than the precision parameter p specified for the data channel.

19. The method in claim 14, wherein the precision parameter p is defined by an increased precision value approaching a theoretical limit of p=∞.

20. The method in claim 14, wherein the quantized representation of the input binary symbols is produced in accordance with a larger alphabet having an additional degree of freedom in attributes as compared with the input binary symbols.

21. The method in claim 20, wherein the additional degree of freedom comprises color.

22. The method in claim 14, wherein the representation alphabet includes non-consecutive integers.

23. The method in claim 14, wherein the representation alphabet includes non-integer numbers.

24. A data device comprising:
a processor; and
a data transfer interface adapted to transfer data to and from a data channel;
wherein the processor controls the transfer of data across the data transfer interface so the data device encodes an unconstrained sequence of input binary symbols into a representation according to an alphabet comprising allowable time intervals between adjacent input binary symbols according to a precision parameter p, a minimum resolution parameter α, and resolution restriction functions L(t) and R(t), thereby defining a precision-resolution (PR) constrained code, and modulates an output signal comprising a waveform having signal peaks corresponding to the representation and separated according to the PR-constrained code for transmission of the output signal over the data channel.

25. The data device in claim 24, wherein the resolution restriction functions are specified by a multiplicative error function given by a resolution factor θ that is specified in accordance with a clock drift parameter δ where 0<δ<1, and θ is defined by θ=(1+δ)/(1−δ) and indicates a minimum disjoint neighborhood between adjacent symbols for the data channel.

26. The data device in claim 24, wherein the resolution restriction functions are specified in accordance with an additive error parameter Δ.

27. The data device in claim 24, wherein the precision parameter p is defined by p>1.

28. The data device in claim 24, wherein the output signal waveform is produced in accordance with an increased precision value p' that is greater than the precision parameter p specified for the data channel.

29. The data device in claim 24, wherein the precision parameter p is defined by an increased precision value approaching a theoretical limit of p=∞.

30. The data device in claim 24, wherein the representation of the input binary symbols is produced in accordance with an enlarged alphabet having an additional degree of freedom in attributes as compared with the representation alphabet.

31. The data device in claim 24, wherein the additional degree of freedom comprises color.

32. The data device in claim 24, wherein the processor further detects a modulated waveform having signal peaks that are separated according to the PR-constrained code and quantizing time intervals between the signal peaks so as to produce a representation in accordance with the representation alphabet and decodes the representation and produces the unconstrained sequence of input binary symbols.

33. The data device in claim 32, wherein a modulator modulates the output signal and transmits the modulated waveform over the data channel, and a detector receives the modulated waveform and performs the detecting.

34. The data device in claim 24, wherein the representation alphabet includes attributes comprising color.

35. The data device in claim 24, wherein the representation alphabet includes non-consecutive integers.

36. The data device in claim 24, wherein the representation alphabet includes non-integer numbers.

37. A system comprising:
a data encoder;
a transmitter/modulator;
a receiver/detector; and
a data decoder;
wherein the data encoder encodes an unconstrained sequence of input binary symbols into a representation according to an alphabet comprising allowable time intervals between adjacent input binary symbols according to a precision parameter p, a minimum resolution parameter α, and resolution restriction functions L(t) and R(t), thereby defining a precision-resolution (PR) constrained code;
wherein the transmitter/modulator modulates an output signal comprising a waveform having signal peaks corresponding to the representation and separated according to the PR-constrained code for transmission of the output signal over the data channel; and
wherein the receiver/detector detects a modulated waveform having signal peaks that are separated according to the PR-constrained code and quantizes time intervals between the signal peaks so as to produce a representation in accordance with the representation alphabet; and
wherein the decoder decodes the representation and produces the unconstrained sequence of input binary symbols.

38. The system in claim 37, wherein the resolution restriction functions are specified by a multiplicative error function given by a resolution factor θ that is specified in accordance with a clock drift parameter δ where 0<δ<1, and θ is defined by θ=(1+δ)/(1−δ) and indicates a minimum disjoint neighborhood between adjacent symbols for the data channel.

39. The system in claim 37, wherein the resolution restriction functions are specified in accordance with an additive error parameter Δ.

40. A system comprising:
a processor; and
program data storage containing machine executable instructions comprising a set of processing rules that are performed by the processor to implement a data encoder that processes unconstrained data comprising a sequence of data bits and maps the unconstrained data onto a modulation coding scheme for encoding data comprising an unconstrained sequence of input binary symbols into a representation according to an alphabet comprising allowable time intervals between adjacent input binary symbols according to a precision parameters, a minimum resolution parameter α, and resolution restriction functions L(t) and R(t), thereby defining a precision-resolution (PR) constrained code, and modulating an output signal comprising a waveform having signal peaks corresponding to the representation and separated according to the PR-constrained code for transmission of the output signal over the data channel, and wherein the data storage further contains a set of processing rules performed by the processor to implement a data decoder that processes constrained data and detects a modulated waveform having signal peaks that are separated according to the PR-constrained code and quantizing time intervals between the signal peaks so as to produce a representation in accordance with the representation alphabet; and decodes the representation and producing the unconstrained sequence of input binary symbols.

41. A system comprising:
a processor; and
data storage containing machine executable instructions comprising a set of processing rules that are performed by the processor to implement a precision resolution (PR) coding scheme, wherein the executable instructions cause the processor to perform operations comprising:
- receiving channel specification parameters comprising transmitter precision parameter p and receiver resolution parameter α for transmission over a data channel in accordance with a target channel capacity and resolution restriction functions L(t) and R(t);
- producing combinations of precision and resolution specifications to achieve the target channel capacity;
- determining a set of allowable time intervals between modulation peaks for a set of data channel symbols;
- determining a translation scheme for encoding and decoding of binary symbols for transmission over the data channel.

42. The system in claim 41, wherein the resolution restriction functions L(t) and R(t) are specified by a multiplicative error function given by a resolution factor θ that is specified in accordance with a clock drift parameter δ where 0<δ<1, and θ is defined by θ=(1+δ)/(1−δ) and indicates a minimum disjoint neighborhood between adjacent symbols for the data channel.

43. The system in claim 42, wherein the executable instructions cause the processor to determine allowable time intervals comprising an alphabet for representation of input binary symbols by adding a minimal symbol t∈R such that t is correctly aligned according to the precision parameter p, is greater than the minimal resolution parameter α, and the function set (L(t), R(t)) has an empty intersection with (L(t'), R(t')) for any t' of any previously selected alphabet symbols.

44. The system in claim 41, wherein the resolution restriction functions are specified in accordance with an additive error parameter Δ.

* * * * *